US008271859B2

(12) United States Patent
Wong et al.

(10) Patent No.: US 8,271,859 B2
(45) Date of Patent: Sep. 18, 2012

(54) SEGMENTED CRC DESIGN IN HIGH SPEED NETWORKS

(75) Inventors: Yuen Wong, San Jose, CA (US); Hui Zhang, Cupertino, CA (US)

(73) Assignee: Foundry Networks LLC, San Jose, CA (US)

( * ) Notice: Subject to any disclaimer, the term of this patent is extended or adjusted under 35 U.S.C. 154(b) by 830 days.

(21) Appl. No.: 11/779,714

(22) Filed: Jul. 18, 2007

(65) Prior Publication Data
US 2009/0282148 A1    Nov. 12, 2009

(51) Int. Cl.
H03M 13/00    (2006.01)
H04H 20/71    (2008.01)
G06F 11/10    (2006.01)
G06F 13/28    (2006.01)
(52) U.S. Cl. ......... 714/781; 370/312; 714/807; 711/170
(58) Field of Classification Search .................. 370/337; 345/531
See application file for complete search history.

(56) References Cited

U.S. PATENT DOCUMENTS

| | | | | |
|---|---|---|---|---|
| 3,866,175 A * | 2/1975 | Seifert et al. | ............. | 340/825.52 |
| 4,325,119 A | 4/1982 | Grandmaison et al. | | |
| 4,348,725 A | 9/1982 | Farrell et al. | | |
| 4,628,480 A * | 12/1986 | Floyd | ................................ | 710/8 |
| 4,667,323 A * | 5/1987 | Engdahl et al. | ................ | 370/451 |
| 4,683,564 A | 7/1987 | Young et al. | | |
| 4,698,748 A * | 10/1987 | Juzswik et al. | ................ | 713/322 |
| 4,723,243 A * | 2/1988 | Joshi et al. | .................... | 714/776 |
| 4,754,482 A * | 6/1988 | Weiss | ............................. | 713/181 |
| 4,791,629 A | 12/1988 | Burns et al. | | |
| 4,794,629 A | 12/1988 | Pastyr et al. | | |
| 4,807,280 A | 2/1989 | Posner et al. | | |
| 4,876,681 A | 10/1989 | Hagiwara et al. | | |
| 4,896,277 A * | 1/1990 | Vercellotti et al. | ................ | 710/9 |
| 4,985,889 A | 1/1991 | Frankish et al. | | |
| 5,101,404 A | 3/1992 | Kunimoto et al. | | |
| 5,136,584 A * | 8/1992 | Hedlund | ........................ | 370/399 |
| 5,195,181 A | 3/1993 | Bryant et al. | | |
| 5,208,856 A * | 5/1993 | Leduc et al. | ................... | 380/229 |
| 5,224,108 A | 6/1993 | McDysan et al. | | |
| 5,231,633 A | 7/1993 | Hluchyj et al. | | |
| 5,280,582 A | 1/1994 | Yang et al. | | |
| 5,282,196 A | 1/1994 | Clebowicz | | |

(Continued)

FOREIGN PATENT DOCUMENTS
EP    1380127 A2    1/2004
(Continued)

OTHER PUBLICATIONS
U.S. Appl. No. 12/400,594, filed Mar. 9, 2009, Patel et al.
(Continued)

Primary Examiner — Krisna Lim
Assistant Examiner — Margishi Desai
(74) Attorney, Agent, or Firm — Fountainhead Law Group P.C.

(57) ABSTRACT

Embodiments of the present invention provide techniques for efficient generation of CRC values in a network environment. Specific embodiments of the present invention enable CRC processing circuits that can generate CRC values at high data throughput rates (e.g., 100 Gbps or greater), while being capable of being implemented on currently available FPGAs. Accordingly, embodiments of the present invention may be used in network devices such as routers, switches, hubs, host network interfaces and the like to support high speed data transmission standards such as 100G Ethernet and beyond.

29 Claims, 11 Drawing Sheets

U.S. PATENT DOCUMENTS

| | | |
|---|---|---|
| 5,287,477 A | 2/1994 | Johnson et al. |
| 5,299,190 A | 3/1994 | LaMaire et al. |
| 5,299,195 A | 3/1994 | Shah |
| 5,301,192 A | 4/1994 | Henrion |
| 5,307,345 A | 4/1994 | Lozowick et al. |
| 5,323,386 A | 6/1994 | Wiher et al. |
| 5,365,512 A | 11/1994 | Combs et al. |
| 5,377,189 A | 12/1994 | Clark |
| 5,390,173 A | 2/1995 | Spinney et al. |
| 5,392,279 A | 2/1995 | Taniguchi |
| 5,406,643 A | 4/1995 | Burke et al. |
| 5,408,469 A | 4/1995 | Opher et al. |
| 5,430,442 A | 7/1995 | Kaiser et al. |
| 5,436,893 A | 7/1995 | Barnett |
| 5,461,615 A | 10/1995 | Henrion |
| 5,490,258 A | 2/1996 | Fenner |
| 5,506,840 A | 4/1996 | Pauwels et al. |
| 5,506,841 A | 4/1996 | Sandquist |
| 5,521,923 A | 5/1996 | Willmann et al. |
| 5,546,385 A | 8/1996 | Caspi et al. |
| 5,550,816 A | 8/1996 | Hardwick et al. |
| 5,563,948 A * | 10/1996 | Diehl et al. .................. 380/229 |
| 5,566,170 A | 10/1996 | Bakke et al. |
| 5,598,410 A | 1/1997 | Stone |
| 5,600,795 A | 2/1997 | Du |
| 5,619,497 A | 4/1997 | Gallagher et al. |
| 5,640,504 A | 6/1997 | Johnson et al. |
| 5,646,878 A | 7/1997 | Samra |
| 5,663,952 A | 9/1997 | Gentry, Jr. |
| 5,663,959 A | 9/1997 | Nakagawa et al. |
| 5,666,353 A | 9/1997 | Klausmeier et al. |
| 5,721,819 A | 2/1998 | Galles et al. |
| 5,732,080 A | 3/1998 | Ferguson et al. |
| 5,734,826 A | 3/1998 | Olnowich et al. |
| 5,740,176 A | 4/1998 | Gupta et al. |
| 5,745,708 A * | 4/1998 | Weppler et al. ............... 710/119 |
| 5,751,710 A | 5/1998 | Crowther et al. |
| 5,802,287 A | 9/1998 | Rostoker et al. |
| 5,815,146 A | 9/1998 | Youden et al. |
| 5,818,816 A | 10/1998 | Chikazawa et al. |
| 5,835,496 A | 11/1998 | Yeung et al. |
| 5,838,684 A | 11/1998 | Wicki et al. |
| 5,862,350 A | 1/1999 | Coulson |
| 5,864,555 A | 1/1999 | Mathur et al. |
| 5,867,675 A | 2/1999 | Lomelino et al. |
| 5,870,538 A | 2/1999 | Manning et al. |
| 5,872,769 A | 2/1999 | Caldara et al. |
| 5,872,783 A | 2/1999 | Chin |
| 5,875,200 A * | 2/1999 | Glover et al. ................. 714/784 |
| 5,896,380 A | 4/1999 | Brown et al. |
| 5,907,566 A | 5/1999 | Benson et al. |
| 5,907,660 A | 5/1999 | Inoue et al. |
| 5,909,686 A | 6/1999 | Muller et al. |
| 5,915,094 A | 6/1999 | Kouloheris et al. |
| 5,920,566 A | 7/1999 | Hendel et al. |
| 5,920,886 A | 7/1999 | Feldmeier |
| 5,936,939 A | 8/1999 | Des Jardins et al. |
| 5,936,966 A | 8/1999 | Ogawa et al. |
| 5,956,347 A | 9/1999 | Slater |
| 5,999,528 A * | 12/1999 | Chow et al. .................... 370/365 |
| 6,000,016 A | 12/1999 | Curtis et al. |
| 6,011,910 A | 1/2000 | Chau et al. |
| 6,016,310 A | 1/2000 | Muller et al. |
| 6,023,471 A | 2/2000 | Haddock et al. |
| 6,031,843 A | 2/2000 | Swanbery et al. |
| 6,035,414 A | 3/2000 | Okazawa et al. |
| 6,038,288 A | 3/2000 | Thomas et al. |
| 6,067,298 A | 5/2000 | Shinohara |
| 6,067,606 A | 5/2000 | Holscher et al. |
| 6,076,115 A | 6/2000 | Sambamurthy et al. |
| 6,081,522 A | 6/2000 | Hendel et al. |
| 6,088,356 A | 7/2000 | Hendel et al. |
| 6,094,434 A | 7/2000 | Kotzur et al. |
| 6,104,696 A | 8/2000 | Kadambi et al. |
| 6,104,700 A | 8/2000 | Haddock et al. |
| 6,104,969 A | 8/2000 | Beeks |
| 6,108,306 A | 8/2000 | Kalkunte et al. |
| 6,118,787 A | 9/2000 | Kalkunte et al. |
| 6,125,417 A | 9/2000 | Bailis et al. |
| 6,128,666 A | 10/2000 | Muller et al. |
| 6,144,668 A | 11/2000 | Bass et al. |
| 6,147,996 A | 11/2000 | Laor et al. |
| 6,151,301 A | 11/2000 | Holden |
| 6,151,497 A | 11/2000 | Yee et al. |
| 6,154,446 A | 11/2000 | Kadambi et al. |
| 6,157,643 A | 12/2000 | Ma |
| 6,160,809 A | 12/2000 | Adiletta et al. |
| 6,160,812 A | 12/2000 | Bauman et al. |
| 6,172,990 B1 | 1/2001 | Deb et al. |
| 6,178,520 B1 | 1/2001 | DeKoning et al. |
| 6,181,699 B1 | 1/2001 | Crinion et al. |
| 6,185,222 B1 | 2/2001 | Hughes |
| 6,195,335 B1 | 2/2001 | Calvignac et al. |
| 6,201,492 B1 | 3/2001 | Amar et al. |
| 6,222,845 B1 | 4/2001 | Shue et al. |
| 6,243,667 B1 | 6/2001 | Kerr et al. |
| 6,249,528 B1 | 6/2001 | Kothary |
| 6,263,374 B1 * | 7/2001 | Olnowich et al. .............. 709/253 |
| 6,272,144 B1 | 8/2001 | Berenbaum et al. |
| 6,304,903 B1 | 10/2001 | Ward |
| 6,320,859 B1 | 11/2001 | Momirov |
| 6,333,929 B1 | 12/2001 | Drottar et al. |
| 6,335,932 B2 | 1/2002 | Kadambi et al. |
| 6,335,935 B2 | 1/2002 | Kadambi et al. |
| 6,343,072 B1 | 1/2002 | Bechtolsheim et al. |
| 6,351,143 B1 | 2/2002 | Guccione et al. |
| 6,356,550 B1 | 3/2002 | Williams |
| 6,356,942 B1 | 3/2002 | Bengtsson et al. |
| 6,359,879 B1 | 3/2002 | Carvey et al. |
| 6,363,077 B1 | 3/2002 | Wong et al. |
| 6,366,557 B1 | 4/2002 | Hunter |
| 6,369,855 B1 | 4/2002 | Chauvel et al. |
| 6,421,352 B1 | 7/2002 | Manaka et al. |
| 6,424,658 B1 | 7/2002 | Mather |
| 6,424,659 B2 | 7/2002 | Viswanadham et al. |
| 6,427,185 B1 | 7/2002 | Ryals et al. |
| 6,430,190 B1 | 8/2002 | Essbaum et al. |
| 6,457,175 B1 | 9/2002 | Lerche |
| 6,459,705 B1 | 10/2002 | Cheng |
| 6,460,088 B1 | 10/2002 | Merchant |
| 6,463,063 B1 | 10/2002 | Bianchini, Jr. et al. |
| 6,466,608 B1 * | 10/2002 | Hong et al. .................... 375/137 |
| 6,470,436 B1 | 10/2002 | Croft et al. |
| 6,473,428 B1 | 10/2002 | Nichols et al. |
| 6,473,433 B1 | 10/2002 | Bianchini, Jr. et al. |
| 6,477,174 B1 | 11/2002 | Dooley et al. |
| 6,480,477 B1 | 11/2002 | Treadaway et al. |
| 6,490,280 B1 | 12/2002 | Leung |
| 6,493,347 B2 | 12/2002 | Sindhu et al. |
| 6,496,502 B1 | 12/2002 | Fite et al. |
| 6,505,281 B1 | 1/2003 | Sherry |
| 6,510,138 B1 | 1/2003 | Pannell |
| 6,522,656 B1 | 2/2003 | Gridley |
| 6,532,229 B1 | 3/2003 | Johnson et al. |
| 6,532,234 B1 | 3/2003 | Yoshikawa |
| 6,535,504 B1 | 3/2003 | Johnson et al. |
| 6,549,519 B1 | 4/2003 | Michels et al. |
| 6,553,370 B1 | 4/2003 | Andreev et al. |
| 6,556,208 B1 | 4/2003 | Congdon et al. |
| 6,567,404 B1 | 5/2003 | Wilford |
| 6,570,884 B1 | 5/2003 | Connery et al. |
| 6,577,631 B1 | 6/2003 | Keenan et al. |
| 6,587,432 B1 | 7/2003 | Putzolu et al. |
| 6,591,302 B2 | 7/2003 | Boucher et al. |
| 6,601,186 B1 | 7/2003 | Fox et al. |
| 6,606,300 B1 | 8/2003 | Blanc et al. |
| 6,628,650 B1 | 9/2003 | Saito et al. |
| 6,633,580 B1 | 10/2003 | Torudbakken et al. |
| 6,636,483 B1 | 10/2003 | Pannell |
| 6,643,269 B1 | 11/2003 | Fan et al. |
| 6,654,342 B1 | 11/2003 | Dittia et al. |
| 6,654,346 B1 | 11/2003 | Mahalingaiah et al. |
| 6,654,370 B1 | 11/2003 | Quirke et al. |
| 6,654,373 B1 | 11/2003 | Maher, III et al. |
| 6,658,002 B1 | 12/2003 | Ross et al. |
| 6,661,791 B1 | 12/2003 | Brown |
| 6,671,275 B1 | 12/2003 | Wong et al. |

| | | |
|---|---|---|
| 6,678,248 B1 | 1/2004 | Haddock et al. |
| 6,681,332 B1 | 1/2004 | Byrne et al. |
| 6,683,872 B1 | 1/2004 | Saito |
| 6,687,217 B1 | 2/2004 | Chow et al. |
| 6,687,247 B1 | 2/2004 | Wilford et al. |
| 6,691,202 B2 | 2/2004 | Vasquez et al. |
| 6,696,917 B1 | 2/2004 | Heitner et al. |
| 6,697,359 B1 | 2/2004 | George |
| 6,697,368 B2 | 2/2004 | Chang et al. |
| 6,700,894 B1 | 3/2004 | Shung |
| 6,708,000 B1 | 3/2004 | Nishi et al. |
| 6,721,229 B1 | 4/2004 | Cole |
| 6,721,268 B1 | 4/2004 | Ohira et al. |
| 6,721,313 B1 | 4/2004 | Van Duyne |
| 6,721,338 B1 | 4/2004 | Sato |
| 6,731,875 B1 | 5/2004 | Kartalopoulos |
| 6,735,218 B2 | 5/2004 | Chang et al. |
| 6,745,277 B1 | 6/2004 | Lee et al. |
| 6,747,971 B1 | 6/2004 | Hughes et al. |
| 6,751,224 B1 | 6/2004 | Parruck et al. |
| 6,754,881 B2 | 6/2004 | Kuhlmann et al. |
| 6,765,866 B1 | 7/2004 | Wyatt |
| 6,775,706 B1 | 8/2004 | Fukumoto et al. |
| 6,778,546 B1 | 8/2004 | Epps et al. |
| 6,781,990 B1 | 8/2004 | Puri et al. |
| 6,785,290 B1 | 8/2004 | Fujisawa et al. |
| 6,788,697 B1 | 9/2004 | Aweya et al. |
| 6,792,484 B1 | 9/2004 | Hook |
| 6,792,502 B1 | 9/2004 | Pandya et al. |
| 6,798,740 B1 | 9/2004 | Senevirathne et al. |
| 6,804,220 B2 * | 10/2004 | Odenwalder et al. ......... 370/337 |
| 6,804,731 B1 | 10/2004 | Chang et al. |
| 6,807,179 B1 | 10/2004 | Kanuri et al. |
| 6,807,363 B1 | 10/2004 | Abiko et al. |
| 6,810,038 B1 | 10/2004 | Isoyama et al. |
| 6,810,046 B2 | 10/2004 | Abbas et al. |
| 6,813,243 B1 | 11/2004 | Epps et al. |
| 6,813,266 B1 | 11/2004 | Chiang et al. |
| 6,816,467 B1 | 11/2004 | Muller et al. |
| 6,831,923 B1 | 12/2004 | Laor et al. |
| 6,831,932 B1 | 12/2004 | Boyle et al. |
| 6,836,808 B2 | 12/2004 | Bunce et al. |
| 6,839,346 B1 | 1/2005 | Kametani |
| 6,842,422 B1 | 1/2005 | Bianchini, Jr. |
| 6,854,117 B1 | 2/2005 | Roberts |
| 6,856,600 B1 | 2/2005 | Russell et al. |
| 6,859,438 B2 | 2/2005 | Haddock et al. |
| 6,865,153 B1 | 3/2005 | Hill et al. |
| 6,901,072 B1 | 5/2005 | Wong |
| 6,906,936 B1 | 6/2005 | James et al. |
| 6,912,637 B1 | 6/2005 | Herbst |
| 6,920,154 B1 | 7/2005 | Aschler |
| 6,925,516 B2 | 8/2005 | Struhsaker et al. |
| 6,934,305 B1 | 8/2005 | Duschatko et al. |
| 6,937,606 B2 | 8/2005 | Basso et al. |
| 6,946,948 B2 | 9/2005 | McCormack et al. |
| 6,957,258 B2 | 10/2005 | Maher, III et al. |
| 6,959,007 B1 | 10/2005 | Vogel et al. |
| 6,973,092 B1 | 12/2005 | Zhou et al. |
| 6,975,599 B1 | 12/2005 | Johnson et al. |
| 6,978,309 B1 | 12/2005 | Dorbolo |
| 6,980,552 B1 | 12/2005 | Belz et al. |
| 6,982,974 B1 | 1/2006 | Saleh et al. |
| 6,990,102 B1 | 1/2006 | Kaniz et al. |
| 6,993,032 B1 | 1/2006 | Dammann et al. |
| 6,996,663 B1 | 2/2006 | Marsteiner |
| 7,005,812 B2 * | 2/2006 | Mitchell ............. 318/400.04 |
| 7,009,968 B2 | 3/2006 | Ambe et al. |
| 7,012,919 B1 | 3/2006 | So et al. |
| 7,050,430 B2 | 5/2006 | Kalkunte et al. |
| 7,080,238 B2 | 7/2006 | Van Hoof et al. |
| 7,082,133 B1 | 7/2006 | Lor et al. |
| 7,103,041 B1 | 9/2006 | Speiser et al. |
| 7,120,744 B2 | 10/2006 | Klein |
| 7,126,948 B2 | 10/2006 | Gooch et al. |
| 7,126,956 B2 | 10/2006 | Scholten |
| 7,151,797 B2 | 12/2006 | Limberg |
| 7,161,948 B2 | 1/2007 | Sampath et al. |
| 7,167,471 B2 | 1/2007 | Calvignac et al. |
| 7,176,911 B1 * | 2/2007 | Kidono et al. ................. 345/207 |
| 7,185,141 B1 | 2/2007 | James et al. |
| 7,185,266 B2 | 2/2007 | Blightman et al. |
| 7,187,687 B1 | 3/2007 | Davis et al. |
| 7,190,696 B1 | 3/2007 | Manur et al. |
| 7,191,277 B2 | 3/2007 | Broyles |
| 7,191,468 B2 | 3/2007 | Hanner |
| 7,203,194 B2 | 4/2007 | Chang et al. |
| 7,206,283 B2 | 4/2007 | Chang et al. |
| 7,212,536 B2 | 5/2007 | MacKiewich et al. |
| 7,218,637 B1 | 5/2007 | Best et al. |
| 7,219,293 B2 * | 5/2007 | Tsai et al. ..................... 714/757 |
| 7,228,509 B1 * | 6/2007 | Dada et al. ..................... 716/1 |
| 7,236,490 B2 | 6/2007 | Chang et al. |
| 7,237,058 B2 | 6/2007 | Srinivasan |
| 7,249,306 B2 * | 7/2007 | Chen ............................ 714/758 |
| 7,266,117 B1 | 9/2007 | Davis |
| 7,272,611 B1 | 9/2007 | Cuppett et al. |
| 7,272,613 B2 | 9/2007 | Sim et al. |
| 7,277,425 B1 | 10/2007 | Sikdar |
| 7,283,547 B1 | 10/2007 | Hook et al. |
| 7,286,534 B2 | 10/2007 | Kloth |
| 7,324,509 B2 | 1/2008 | Ni |
| 7,355,970 B2 | 4/2008 | Lor |
| 7,356,030 B2 | 4/2008 | Chang et al. |
| 7,366,100 B2 | 4/2008 | Anderson et al. |
| 7,391,769 B2 | 6/2008 | Rajkumar et al. |
| 7,428,693 B2 * | 9/2008 | Obuchi et al. ................. 714/804 |
| 7,468,975 B1 | 12/2008 | Davis |
| 7,512,127 B2 | 3/2009 | Chang et al. |
| 7,558,193 B2 | 7/2009 | Bradbury et al. |
| 7,561,590 B1 | 7/2009 | Walsh |
| 7,596,139 B2 | 9/2009 | Patel et al. |
| 7,609,617 B2 | 10/2009 | Appanna et al. |
| 7,613,991 B1 * | 11/2009 | Bain ............................ 714/807 |
| 7,636,369 B2 | 12/2009 | Wong |
| 7,649,885 B1 | 1/2010 | Davis |
| 7,657,703 B1 | 2/2010 | Singh |
| 7,738,450 B1 | 6/2010 | Davis |
| 7,813,367 B2 | 10/2010 | Wong et al. |
| 7,903,654 B2 | 3/2011 | Bansal |
| 7,933,947 B2 | 4/2011 | Fleischer et al. |
| 7,948,872 B2 | 5/2011 | Patel et al. |
| 7,953,922 B2 | 5/2011 | Singh |
| 7,953,923 B2 | 5/2011 | Singh |
| 8,014,278 B1 | 9/2011 | Subramanian et al. |
| 8,037,399 B2 | 10/2011 | Wong et al. |
| 8,090,901 B2 | 1/2012 | Lin et al. |
| 2001/0001879 A1 | 5/2001 | Kubik et al. |
| 2001/0007560 A1 | 7/2001 | Masuda et al. |
| 2001/0026551 A1 | 10/2001 | Horlin |
| 2001/0048785 A1 | 12/2001 | Steinberg |
| 2001/0053150 A1 | 12/2001 | Clear et al. |
| 2002/0001307 A1 | 1/2002 | Nguyen et al. |
| 2002/0040417 A1 | 4/2002 | Winograd et al. |
| 2002/0054594 A1 | 5/2002 | Hoof et al. |
| 2002/0054595 A1 | 5/2002 | Ambe et al. |
| 2002/0069294 A1 | 6/2002 | Herkersdorf et al. |
| 2002/0073073 A1 | 6/2002 | Cheng |
| 2002/0085499 A1 | 7/2002 | Toyoyama et al. |
| 2002/0087788 A1 | 7/2002 | Morris |
| 2002/0089937 A1 | 7/2002 | Venkatachary et al. |
| 2002/0089977 A1 | 7/2002 | Chang et al. |
| 2002/0091844 A1 | 7/2002 | Craft et al. |
| 2002/0091884 A1 | 7/2002 | Chang et al. |
| 2002/0105966 A1 | 8/2002 | Patel et al. |
| 2002/0126672 A1 | 9/2002 | Chow et al. |
| 2002/0131437 A1 | 9/2002 | Tagore-Brage |
| 2002/0141403 A1 | 10/2002 | Akahane et al. |
| 2002/0146013 A1 | 10/2002 | Karlsson et al. |
| 2002/0161967 A1 | 10/2002 | Kirihata et al. |
| 2002/0169786 A1 | 11/2002 | Richek |
| 2002/0191605 A1 | 12/2002 | Van Lunteren et al. |
| 2003/0009466 A1 | 1/2003 | Ta et al. |
| 2003/0012198 A1 | 1/2003 | Kaganoi et al. |
| 2003/0043800 A1 | 3/2003 | Sonksen et al. |
| 2003/0043848 A1 | 3/2003 | Sonksen |
| 2003/0061459 A1 | 3/2003 | Aboulenein et al. |
| 2003/0074657 A1 | 4/2003 | Bramley, Jr. |

| | | |
|---|---|---|
| 2003/0081608 A1 | 5/2003 | Barri et al. |
| 2003/0095548 A1 | 5/2003 | Yamano |
| 2003/0103499 A1 | 6/2003 | Davis et al. |
| 2003/0103500 A1 | 6/2003 | Menon et al. |
| 2003/0108052 A1 | 6/2003 | Inoue et al. |
| 2003/0110180 A1 | 6/2003 | Calvignac et al. |
| 2003/0115403 A1 | 6/2003 | Bouchard et al. |
| 2003/0120861 A1 | 6/2003 | Calle et al. |
| 2003/0128668 A1 | 7/2003 | Yavatkar et al. |
| 2003/0137978 A1 | 7/2003 | Kanetake |
| 2003/0152084 A1 | 8/2003 | Lee et al. |
| 2003/0152096 A1 | 8/2003 | Chapman |
| 2003/0156586 A1 | 8/2003 | Lee et al. |
| 2003/0159086 A1 | 8/2003 | Arndt |
| 2003/0165160 A1 | 9/2003 | Minami et al. |
| 2003/0169470 A1 | 9/2003 | Alagar et al. |
| 2003/0177221 A1 | 9/2003 | Ould-Brahim et al. |
| 2003/0198182 A1 | 10/2003 | Pegrum et al. |
| 2003/0200343 A1 | 10/2003 | Greenblat et al. |
| 2003/0214956 A1 | 11/2003 | Navada et al. |
| 2003/0223424 A1 | 12/2003 | Anderson et al. |
| 2003/0223466 A1 | 12/2003 | Noronha, Jr. et al. |
| 2003/0227943 A1 | 12/2003 | Hallman et al. |
| 2004/0022263 A1 | 2/2004 | Zhao et al. |
| 2004/0028060 A1 | 2/2004 | Kang |
| 2004/0054867 A1 | 3/2004 | Stravers et al. |
| 2004/0062245 A1 | 4/2004 | Sharp et al. |
| 2004/0062246 A1 | 4/2004 | Boucher et al. |
| 2004/0088469 A1 | 5/2004 | Levy |
| 2004/0128434 A1 | 7/2004 | Khanna et al. |
| 2004/0141504 A1 | 7/2004 | Blanc |
| 2004/0179548 A1 | 9/2004 | Chang et al. |
| 2004/0190547 A1* | 9/2004 | Gordy et al. ............... 370/463 |
| 2004/0208177 A1 | 10/2004 | Ogawa |
| 2004/0208181 A1 | 10/2004 | Clayton et al. |
| 2004/0223502 A1 | 11/2004 | Wybenga et al. |
| 2004/0235480 A1 | 11/2004 | Rezaaifar et al. |
| 2004/0264380 A1 | 12/2004 | Kalkunte et al. |
| 2005/0010630 A1* | 1/2005 | Doering et al. ............ 708/490 |
| 2005/0010849 A1 | 1/2005 | Ryle et al. |
| 2005/0041684 A1 | 2/2005 | Reynolds et al. |
| 2005/0089049 A1 | 4/2005 | Chang et al. |
| 2005/0097432 A1* | 5/2005 | Obuchi et al. ............. 714/800 |
| 2005/0120122 A1 | 6/2005 | Farnham |
| 2005/0132132 A1 | 6/2005 | Rosenbluth et al. |
| 2005/0132179 A1 | 6/2005 | Glaum et al. |
| 2005/0138276 A1 | 6/2005 | Navada et al. |
| 2005/0144369 A1 | 6/2005 | Jaspers |
| 2005/0152324 A1 | 7/2005 | Benveniste |
| 2005/0152335 A1 | 7/2005 | Lodha et al. |
| 2005/0169317 A1 | 8/2005 | Prueckelmayer |
| 2005/0175018 A1 | 8/2005 | Wong |
| 2005/0185577 A1 | 8/2005 | Sakamoto et al. |
| 2005/0185652 A1 | 8/2005 | Iwamoto |
| 2005/0193316 A1* | 9/2005 | Chen ........................... 714/758 |
| 2005/0201387 A1 | 9/2005 | Willis |
| 2005/0226236 A1 | 10/2005 | Klink |
| 2005/0246508 A1 | 11/2005 | Shaw |
| 2005/0249124 A1 | 11/2005 | Elie-Dit-Cosaque et al. |
| 2006/0031610 A1* | 2/2006 | Liav et al. .................. 710/66 |
| 2006/0034452 A1* | 2/2006 | Tonomura et al. .......... 380/28 |
| 2006/0050690 A1 | 3/2006 | Epps et al. |
| 2006/0077891 A1 | 4/2006 | Smith et al. |
| 2006/0092829 A1 | 5/2006 | Brolin et al. |
| 2006/0092929 A1 | 5/2006 | Chun |
| 2006/0114876 A1 | 6/2006 | Kalkunte |
| 2006/0146374 A1* | 7/2006 | Ng et al. ..................... 358/474 |
| 2006/0165089 A1 | 7/2006 | Klink |
| 2006/0209685 A1 | 9/2006 | Rahman et al. |
| 2006/0221841 A1 | 10/2006 | Lee et al. |
| 2006/0268680 A1 | 11/2006 | Roberts et al. |
| 2007/0038798 A1 | 2/2007 | Bouchard et al. |
| 2007/0088974 A1 | 4/2007 | Chandwani et al. |
| 2007/0127464 A1 | 6/2007 | Jain et al. |
| 2007/0179909 A1 | 8/2007 | Channasagara |
| 2007/0208876 A1 | 9/2007 | Davis |
| 2007/0235420 A1 | 10/2007 | Yamazawa |
| 2007/0253420 A1 | 11/2007 | Chang et al. |
| 2007/0258475 A1 | 11/2007 | Chinn et al. |
| 2007/0288690 A1 | 12/2007 | Wang et al. |
| 2008/0002707 A1 | 1/2008 | Davis |
| 2008/0031263 A1 | 2/2008 | Ervin et al. |
| 2008/0037544 A1 | 2/2008 | Yano et al. |
| 2008/0049742 A1 | 2/2008 | Bansal |
| 2008/0069125 A1 | 3/2008 | Reed et al. |
| 2008/0092020 A1* | 4/2008 | Hasenplaugh et al. ....... 714/781 |
| 2008/0095169 A1 | 4/2008 | Chandra et al. |
| 2008/0117075 A1 | 5/2008 | Seddigh et al. |
| 2008/0181103 A1 | 7/2008 | Davies |
| 2008/0205407 A1 | 8/2008 | Chang et al. |
| 2008/0307288 A1* | 12/2008 | Ziesler et al. ................ 714/758 |
| 2009/0175178 A1* | 7/2009 | Yoon et al. .................. 370/252 |
| 2009/0279423 A1 | 11/2009 | Suresh et al. |
| 2009/0279440 A1 | 11/2009 | Wong et al. |
| 2009/0279441 A1 | 11/2009 | Wong et al. |
| 2009/0279541 A1 | 11/2009 | Wong et al. |
| 2009/0279542 A1 | 11/2009 | Wong et al. |
| 2009/0279546 A1 | 11/2009 | Davis |
| 2009/0279548 A1 | 11/2009 | Davis et al. |
| 2009/0279549 A1 | 11/2009 | Ramanathan et al. |
| 2009/0279558 A1 | 11/2009 | Davis et al. |
| 2009/0279559 A1 | 11/2009 | Wong et al. |
| 2009/0279561 A1 | 11/2009 | Chang et al. |
| 2009/0282322 A1 | 11/2009 | Wong et al. |
| 2009/0287952 A1 | 11/2009 | Patel et al. |
| 2009/0290499 A1 | 11/2009 | Patel et al. |
| 2010/0034215 A1 | 2/2010 | Patel et al. |
| 2010/0046521 A1 | 2/2010 | Wong |
| 2010/0061393 A1 | 3/2010 | Wong |
| 2010/0100671 A1 | 4/2010 | Singh |
| 2010/0135313 A1 | 6/2010 | Davis |
| 2010/0161894 A1 | 6/2010 | Singh |
| 2010/0293327 A1 | 11/2010 | Lin et al. |
| 2011/0002340 A1 | 1/2011 | Davis |
| 2011/0044340 A1 | 2/2011 | Bansal et al. |
| 2011/0069711 A1 | 3/2011 | Jha et al. |
| 2011/0110237 A1 | 5/2011 | Wong et al. |

FOREIGN PATENT DOCUMENTS

| | | |
|---|---|---|
| JP | 2003-289359 A | 10/2003 |
| JP | 2004-537871 T | 12/2004 |
| WO | WO 01/84728 A1 | 11/2001 |
| WO | WO 02/41544 A2 | 5/2002 |

OTHER PUBLICATIONS

U.S. Appl. No. 12/400,645, filed Mar. 9, 2009, Patel et al.
U.S. Appl. No. 12/372,390, filed Feb. 17, 2009, Chang et al.
U.S. Appl. No. 12/417,913, filed Apr. 3, 2009, Patel et al.
Final Office Action for U.S. Appl. No. 10/140,751, Mailed Mar. 17, 2009, 17 pages.
Non-Final Office Action for U.S. Appl. No. 11/615,769, Mailed Apr. 15, 2009, 11 pages.
Non-Final Office Action for U.S. Appl. No. 11/621,038, Mailed Apr. 23, 2009, 44 pages.
Non-Final Office Action for U.S. Appl. No. 11/745,008, Mailed May 14, 2009, 27 pages.
Non Final Office Action for U.S. Appl. No. 11/804,977, Mailed Jan. 14, 2008, 13 pages.
Notice of Allowance for U.S. Appl. No. 11/804,977, Mailed Nov. 19, 2008, 17 pages.
U.S. Appl. No. 11/779,778, filed Jul. 18, 2007, Wong et al.
U.S. Appl. No. 11/8288,246, filed Jul. 25, 2007, Davis.
U.S. Appl. No. 11/621,038, filed Jan. 8, 2007, Davis et al.
U.S. Appl. No. 11/724,965.
U.S. Appl. No. 11/586,991, filed Oct. 25, 2006, Ramanathan.
U.S. Appl. No. 11/831,950, filed Jul. 31, 2007, Ravindran et al.
U.S. Appl. No. 11/118,697, filed Apr. 28, 2005, Singh.
U.S. Appl. No. 11/953,742, filed Dec. 10, 2007, Wong et al.
U.S. Appl. No. 11/953,743, filed Dec. 10, 2007, Wong et al.
U.S. Appl. No. 11/953,745, filed Dec. 10, 2007, Wong et al.
U.S. Appl. No. 11/953,751, filed Dec. 10, 2007, Wong et al.
U.S. Appl. No. 10/141,223, filed May 7, 2002, Veerabadran et al.
U.S. Appl. No. 10/140,753, filed May 6, 2002, Davis et al.
U.S. Appl. No. 10/140,752, filed May 6, 2002, Davis.
U.S. Appl. No. 10/140,751, filed May 6, 2002, Davis et al.

U.S. Appl. No. 10/140,749, filed May 6, 2002, Davis et al.
U.S. Appl. No. 10/139,912, filed May 6, 2002, Davis et al.
U.S. Appl. No. 10/810,208, filed Mar. 26, 2004, Wong et al.
U.S. Appl. No. 10/832,086, filed Apr. 26, 2004, Wong.
International Search Report of Jun. 17, 2003 for application No. PCT/US03/08719.
10 Gigabit Ethernet—Technology Overview White Paper, Sep. 2001, 16 pages.
10 Gigabit Ethernet Alliance, Interconnection with Wide Area Networks, Version 1.0, Mar. 2002, 5 pages.
Degermark, M., et al., "Small Forwarding Tables for Fast Routing Lookups," *ACM Computer Communications Review*, 27(4):3-14, Oct. 1997.
Foundry Networks, "BigIron Architecture Technical Brief," Oct. 1998—Version 1.0, 15 pages.
Foundry Networks, "BigIron Architecture Technical Brief," Oct. 1998—Version 1.02, 15 pages.
Foundry Networks, "BigIron Architecture Technical Brief," Dec. 1998—Version 1.03, 14 pages.
Foundry Networks, "BigIron Architecture Technical Brief," May 1999—Version 2.0, 15 pages.
Foundry Networks, "BigIron Architecture Technical Brief," May, 1999—Version 2.01, 15 pages.
Foundry Networks, "BigIron Architecture Technical Brief," Jul. 2001—Version 2.02, 16 pages.
Foundry Networks, Foundry Networks, "Next Generation Terabit System Architecture—The High Performance Revolution for 10 Gigabit Networks," Nov. 17, 2003.
Gigabit Ethernet Alliance—"Accelerating the Standard for Speed," Copyright 1998, 10 pages.
Kichorowsky et al., "Mindspeed.TM. Switch Fabric Offers the Most Comprehensive Solution for Multi-Protocol Networking Equipment," Apr. 30, 2001, 3 pages.
Matsumoto et al., "Switch Fabrics Touted at Interconnects Conference," Aug. 21, 200, URL=http://www.eetimes.com/story/OEG20000821S0011, accessed Aug. 12, 200, 2 pages.
Mcauley et al., "Fast Routing Table Lookup Using CAMs," Proceedings of INFOCOM, Mar.-Apr. 1993, pp. 1382-1391.
Foundry Networks, "JetCore™ Based Chassis Systems—An Architecture Brief on NetIron, BirIron, and FastIron Systems," Jan. 17, 2003.
Mier Communcations, Inc., "Lab Testing Summary Report—Product Category: Layer-3 Switches, Vendor Tested:, Product Tested: Foundry Networks, BirIron 4000," Report No. 231198, Oct. 1998, 6 pages.
Mier Communications, Inc., "Lab Testing Summary Report—Product Category: Gigabit Backbone Switches, Vendor Tested: Foundry Networks, Products Tested: BigIron 4000," Report No. 210998, Sep. 1998, 6 pages.
Mindspeed—A Conexant Business, "Switch Fabric Chipset—CX27300 iScale.TM.," Apr. 30, 2001, 2 pages.
Mindspeed—A Conexant Business, "17x17 3.2 Gbps Crosspoint Switch with Input Equalization—M21110," Feb. 1, 2001, 2 pages.
The Tolly Group, "Foundry Networks, Inc.—BigIron 4000, Layer 2 & Layer 3 Interoperability Evaluation," No. 199133, Oct. 1999, 4 pages.
The Tolly Group, "Foundry Networks, Inc.—BigIron 8000 Gigabit Ethernet Switching Router, Layer 2 & Layer 3 Performance Evaluation," No. 199111, May, 1999, 4 pages.
Spurgeon, C., "Éthernet, The Definitive Guide," O'Reilly & Associates, Inc., Sebastapol, CA, Feb. 2000.
ANSI/IEEE Standard 802.1D, 1998 Edition (373 pages).
Belhadj et al., "Feasibility of a 100GE MAC" IEEE Meeting Nov. 2006, 18 pages.
Braun et al., "Fast incremental CRC updates for IP over ATM networks," IEEE Workshop on High Performance Switching and Routing, 2001, pp. 48-52.
Satran et al., "Out of Order Incremental CRC Computation," IEEE Transactions on Computers, vol. 54, Issue 9 Sep. 2005), pp. 1178-1181.
Newton, Newton's Telecom Dictionary, CMP Books, Mar. 2004, 20th Ed., p. 617.

International Preliminary Examination Report for Application No. PCT/US2001/043113, mailed Nov. 6, 2003, 6pages.
Written Opinion of the International Searching Authority for Application No. PCT/US2001/043113, mailed May 1, 2003, 6 pages.
International Search Report for Application No. PCT/US2001/043113, mailed Dec. 13, 2002, 2 pages.
Non-Final Office Action for U.S. Appl. No. 09/855,024. mailed Jun. 4, 2002, 10 pages.
Final Office Action for U.S. Appl. No. 09/855,024, mailed Jan. 15, 2003, 20 pages.
Advisory Action for U.S. Appl. No. 09/855,024, mailed May 2, 2003.
Notice of Allowance for U.S. Appl. No. 09/855,024, mailed Nov. 3, 2003.
Notice of Allowance for U.S. Appl. No. 09/855,024, mailed Dec. 15, 2003. 6 pages.
Non-Final Office Action for U.S. Appl. No. 10/810,301, mailed Mar. 17, 2005, 11 pages.
Non-Final Office Action for U.S. Appl. No. 10/810,301, mailed Feb. 16, 2006, 12 pages.
Notice of Allowance for U.S. Appl. No. 10/810,301, mailed Jul. 28, 2006, 5 pages.
Notice of Allowance for U.S. Appl. No. 10/810,301, mailed Feb. 6, 2007, 9 pages.
Non-Final Office Action for U.S. Appl. No. 09/855,025, mailed Nov. 23, 2004, 17 pages.
Non-Final Office Action for U.S. Appl. No. 09/855,031, mailed May 22, 2002.
Non-Final Office Action for U.S. Appl. No. 09/855,031, mailed Dec. 10, 2002.
Final Office Action for U.S. Appl. No. 09/855,031, mailed Jul. 30, 2003.
Notice of Allowance for U.S. Appl. No. 09/855,031, mailed Nov. 4, 2003.
Non-Final Office Action for U.S. Appl. No. 10/736,680, mailed Feb. 16, 2006, 18 pages.
Final Office Action for U.S. Appl. No. 10/736,680, mailed Aug. 3, 2006, 10 pages.
Notice of Allowance for U.S. Appl. No. 10/736,680, mailed Feb. 22, 2007, 12 pages.
Non-Final Office Action for U.S. Appl. No. 10/210,041, mailed Sep. 10, 2003, 12 pages.
Final Office Action for U.S. Appl. No. 10/210,041, mailed Jan. 7, 2004, 14 pages.
Non-Final Office Action for U.S. Appl. No. 10/210,041, mailed Mar. 11, 2004, 12 pages.
Final Office Action for U.S. Appl. No. 10/210,041, mailed Jul. 7, 2004, 13 pages.
Non-Final Office Action for U.S. Appl. No. 10/210,041, mailed Feb. 9, 2005, 7 pages.
Final Office Action for U.S. Appl. No. 10/210,041, mailed Aug. 24, 2005, 7 pages.
Advisory Action for U.S. Appl. No. 10/210,041, mailed Dec. 13, 2005, 4 pages.
Non-Final Office Action for U.S. Appl. No. 10/210,108, mailed Jun. 12, 2003, 6 pages.
Notice of Allowance for U.S. Appl. No. 10/210,108, mailed Oct. 7, 2003.
Requirement for Restriction/Election for U.S. Appl. No. 10/438,545, mailed Oct. 31, 2003.
Non-Final Office Action for U.S. Appl. No. 10/438,545, mailed Dec. 12, 2003, 7 pages.
Notice of Allowance for U.S. Appl. No. 10/438,545, mailed Jun. 15, 2004, 4 pages.
Non-Final Office Action for U.S. Appl. No. 11/611,067, mailed Feb. 20, 2009, 11 pages.
Non-Final Office Action for U.S. Appl. No. 10/832,086, mailed Sep. 19, 2007, 12 pages.
Final Office Action for U.S. Appl. No. 10/832,086, mailed May 1, 2008, 31 pages.
Advisory Action for U.S. Appl. No. 10/832,086, mailed Jul. 21, 2008, 4 pages.
Non-Final Office Action for U.S. Appl. No. 10/832,086, mailed Sep. 18, 2008, 18 pages.

Non-Final Office Action for U.S. Appl. No. 11/586,991, mailed Oct. 2, 2008, 23 pages.
Non-Final Office Action for U.S. Appl. No. 10/810,208, mailed Jul. 16, 2007, 24 pages.
Non-Final Office Action for U.S. Appl. No. 10/810,208, mailed Dec. 18, 2007, 40 pages.
Final Office Action for U.S. Appl. No. 10/810,208, mailed Jun. 11, 2008, 34 pages.
Advisory Action for U.S. Appl. No. 10/810,208, mailed Aug. 27, 2008, 4 pages.
Non-Final Office Action for U.S. Appl. No. 10/810,208, mailed Feb. 13, 2009, 17 pages.
Requirement for Restriction/Election for U.S. Appl. No. 10/140,752, mailed May 18, 2006, 8 pages.
Non-Final Office Action for U.S. Appl. No. 10/140,752, mailed Dec. 14, 2006, 17 pages.
Non-Final Office Action for U.S. Appl. No. 10/140,752, mailed Apr. 23, 2007, 6 pages.
Non-Final Office Action for U.S. Appl. No. 10/140,752, mailed Jan. 24, 2008, 8 pages.
Notice of Allowance of U.S. Appl. No. 10/140,752, mailed Jul. 24, 2008, 14 pages.
Notice of Allowance of U.S. Appl. No. 10/140,752, mailed Sep. 10, 2008, 4 pages.
Non-Final Office Action for U.S. Appl. No. 11/854,486, mailed Jul. 20, 2009, 29 pages.
Non-Final Office Action for U.S. Appl. No. 10/139,912, mailed Jan. 25, 2006, 14 pages.
Final Office Action for U.S. Appl. No. 10/139,912, mailed Aug. 11, 2006, 26 pages.
Non-Final Office Action for U.S. Appl. No. 10/139,912, mailed Apr. 20, 2007, 20 pages.
Final Office Action for U.S. Appl. No. 10/139,912, mailed Nov. 28, 2007, 20 pages.
Non-Final Office Action for U.S. Appl. No. 10/139,912, mailed Aug. 1, 2008, 21 pages.
Notice of Allowance for U.S. Appl. No. 10/139,912, mailed Feb. 5, 2009, 8 pages.
Notice of Allowance for U.S. Appl. No. 10/139,912, mailed Jun. 8, 2009, 8 pages.
Requirement for Restriction/Election for U.S. Appl. No. 10/140,751, mailed Apr. 27, 2006, 5 pages.
Non-Final Office Action for U.S. Appl. No. 10/140,751, mailed Aug. 10, 2006, 15 pages.
Final Office Action for U.S. Appl. No. 10/140,751, mailed Apr. 10, 2007, 16 pages.
Non-Final Office Action for U.S. Appl. No. 10/140,751, mailed Oct. 30, 2007, 14 pages.
Final Office Action for U.S. Appl. No. 10/140,751, mailed May 28, 2008, 19 pages.
Non-Final Office Action for U.S. Appl. No. 10/140,751, mailed Sep. 17, 2008, 15 pages.
Advisory Action for U.S. Appl. No. 10/140,751, mailed Jun. 1, 2009, 3 pages.
Non-Final Office Action for U.S. Appl. No. 10/141,223, mailed Feb. 23, 2006, 25 pages.
Non-Final Office Action for U.S. Appl. No. 10/141,223, mailed Feb. 13, 2007, 29 pages.
Final Office Action for U.S. Appl. No. 10/141,223, mailed Aug. 21, 2007, 25 pages.
Non-Final Office Action for U.S. Appl. No. 10/141,223, mailed Dec. 28, 2007, 13 pages.
Non-Final Office Action for U.S. Appl. No. 10/141,223, mailed Sep. 3, 2008, 22 pages.
Non-Final Office Action for U.S. Appl. No. 10/139,831, mailed Oct. 17, 2005, 7 pages.
Notice of Allowance for U.S. Appl. No. 10/139,831, mailed Feb. 9, 2006, 7 pages.
Non-Final Office Action for U.S. Appl. No. 10/139,831, mailed Jun. 27, 2006, 9 pages.
Final Office Action for U.S. Appl. No. 10/139,831, mailed Nov. 28, 2006, 17 pages.
Notice of Allowance for U.S. Appl. No. 10/139,831, mailed Jun. 14, 2007, 26 pages.
Notice of Allowance for U.S. Appl. No. 10/139,831, mailed Jun. 26, 2007, 25 pages.
Non-Final Office Action for U.S. Appl. No. 11/828,246, mailed Jun. 15, 2009, 26 pages.
Non-Final Office Action for U.S. Appl. No. 10/140,088, mailed Apr. 27, 2006, 13 pages.
Notice of Allowance for U.S. Appl. No. 10/140,088, mailed Sep. 7, 2006, 13 pages.
Notice of Allowance for U.S. Appl. No. 10/140,088, mailed Oct. 24, 2006, 8 pages.
Notice of Allowance for U.S. Appl. No. 10/140,088, mailed Jan. 11, 2007, 5 pages.
Non-Final Office Action for U.S. Appl. No. 10/140,749, mailed Aug. 10, 2006, 22 pages.
Final Office Action for U.S. Appl. No. 10/140,749, mailed Jun. 27, 2007, 23 pages.
Final Office Action for U.S. Appl. No. 10/140,749, mailed Jan. 8, 2008, 23 pages.
Non-Final Office Action for U.S. Appl. No. 10/140,749, mailed Jun. 6, 2008, 28 pages.
Final Office Action for U.S. Appl. No. 10/140,749, mailed Dec. 8, 2008, 30 pages.
Non-Final Office Action for U.S. Appl. No. 10/140,749, mailed May 27, 2009, 38 pages.
Non-Final Office Action for U.S. Appl. No. 10/140,753, mailed Apr. 20, 2006, 11 pages.
Final Office Action for U.S. Appl. No. 10/140,753, mailed Jan. 10, 2007, 27 pages.
Non-Final Office Action for U.S. Appl. No. 10/140,753, mailed Aug. 22, 2007, 14 pages.
Non-Final Office Action for U.S. Appl. No. 10/140,753, mailed Jan. 8, 2008, 14 pages.
Final Office Action for U.S. Appl. No. 10/140,753, mailed Aug. 25, 2008, 22 pages.
Requirement for Restriction/Election for U.S. Appl. No. 11/000,359, mailed Jun. 20, 2008, 7 pages.
Non-Final Office Action for U.S. Appl. No. 11/000,359, mailed Oct. 23, 2008, 28 pages.
Non-Final Office Action for U.S. Appl. No. 11/000,359, mailed May 29, 2009, 14 pages.
Requirement for Restriction/Election for U.S. Appl. No. 11/118,697, mailed Jun. 2, 2009, 8 pages.
Non-Final Office Action for U.S. Appl. No. 09/855,038, mailed Jun. 2, 2005, 14 pages.
Final Office Action for U.S. Appl. No. 09/855,038, mailed Feb. 7, 2006, 8 pages.
Non-Final Office Action for U.S. Appl. No. 09/855,038, mailed Oct. 4, 2006, 14 pages.
Notice of Allowance for U.S. Appl. No. 09/855,038, mailed Apr. 26, 2007, 8 pages.
Requirement for Restriction/Election for U.S. Appl. No. 09/988,066, mailed Dec. 13, 2005, 7 pages.
Non-Final Office Action for U.S. Appl. No. 09/988,066, mailed Jul. 14, 2006, 17 pages.
Non-Final Office Action for U.S. Appl. No. 09/988,066, mailed Apr. 6, 2007, 22 pages.
Final Office Action for U.S. Appl. No. 09/988,066, mailed Oct. 31, 2007, 16 pages.
Advisory Action for U.S. Appl. No. 09/988,066, mailed May 28, 2008, 4 pages.
Notice of Allowance for U.S. Appl. No. 09/988,066, mailed Oct. 30, 2008, 16 pages.
Non-Final Office Action for U.S. Appl. No. 09/855,015, mailed Oct. 28, 2004, 12 pages.
Non-Final Office Action for U.S. Appl. No. 09/855,015, mailed Jan. 12, 2006, 6 pages.
Notice of Allowance for U.S. Appl. No. 09/855,015, mailed Sep. 8, 2006, 3 pages.
Requirement for Restriction/Election for U.S. Appl. No. 09/855,015, mailed Nov. 3, 2006, 6 pages.

Notice of Allowance for U.S. Appl. No. 09/855,015, mailed Jan. 7, 2008, 4 pages.
Supplemental Notice of Allowance for U.S. Appl. No. 09/855,015, mailed Feb. 4, 2008, 3 pages.
Notice of Allowance for U.S. Appl. No. 09/988,066, Mailed Jan. 9, 2009, 13 pages.
Non-Final Office Action for U.S. Appl. No. 11/668,322, Dated Mar. 23, 2009, 19 pages.
Non-Final Office Action for U.S. Appl. No. 10/832,086, Mailed Apr. 1, 2009, 17 pages.
Final Office Action for U.S. Appl. No. 10/832,086, mailed on Sep. 29, 2009, 26 pages.
Non-Final Office Action for U.S. Appl. No. 11/831,950, mailed on Aug. 18, 2009, 49 pages.
U.S. Appl. No. 12/198,697, filed Aug. 26, 2008, Hsu et al.
U.S. Appl. No. 12/505,390, filed Jul. 17, 2009, Patel et al.
Non-Final Office Action for U.S. Appl. No. 10/810,208, mailed on Aug. 24, 2009, 38 pages.
Non-Final Office Action for U.S. Appl. No. 10/140,751, mailed on Sep. 28, 2009, 34 pages.
Notice of Allowance for U.S. Appl. No. 11/000,359, mailed on Sep. 22, 2009, 17 pages.
Notice of Allowance for U.S. Appl. No. 11/118,697, mailed on Sep. 30, 2009, 41 pages.
U.S. Appl. No. 12/639,762, filed Dec. 16, 2009, Singh.
U.S. Appl. No. 12/639,749, filed Dec. 16, 2009, Singh.
U.S. Appl. No. 12/624,300, filed Nov. 23, 2009, Davis et al.
U.S. Appl. No. 12/608,985, filed Oct. 29, 2009, Wong.
U.S. Appl. No. 12/608,972, filed Oct. 29, 2009, Wong.
Non-Final Office Action for U.S. Appl. No. 11/953,742, mailed on Nov. 19, 2009, 51 pages.
Non-Final Office Action for U.S. Appl. No. 11/953,743, mailed on Nov. 23, 2009, 47 pages.
Non-Final Office Action for U.S. Appl. No. 11/953,745, mailed on Nov. 24, 2009, 48 pages.
Non-Final Office Action for U.S. Appl. No. 11/953,751, mailed on Nov. 16, 2009, 55 pages.
Requirement for Restriction/Election for U.S. Appl. No. 11/668,322, mailed on Oct. 29, 2009, 6 pages.
Notice of Allowance for U.S. Appl. No. 10/139,912, mailed on Oct. 19, 2009, 17 pages.
Notice of Allowance for U.S. Appl. No. 11/828,246, mailed on Nov. 16, 2009, 20 pages.
Final Office Action for U.S. Appl. No. 11/611,067, mailed on Oct. 16, 2009, 35 pages.
Non-Final Office Action for U.S. Appl. No. 11/611,067, mailed on Dec. 8, 2009, 11 pages.
Final Office Action for U.S. Appl. No. 11/831,950, mailed on Jan. 6, 2010, 21 pages.
Non-Final Office Action for U.S. Appl. No. 11/854,486, mailed on Jan. 12, 2010, 23 pages.
Supplemental Notice of Allowance for U.S. Appl. No. 10/139,912, mailed on Nov. 23, 2009, 4 pages.
Final Office Action for U.S. Appl. No. 11/745,008, mailed on Dec. 30, 2009, 27 pages.
Final Office Action for U.S. Appl. No. 11/621,038, mailed on Dec. 23, 2009, 27 pages.
Non-Final Office Action for U.S. Appl. No. 12/198,697, mailed on Feb. 2, 2010, 50 pages.
Final Office Action for U.S. Appl. No. 10/140,749, mailed on Jan. 13, 2010, 44 pages.
Final Office Action for U.S. Appl. No. 11/615,769, mailed on Jan. 22, 2010, 34 pages.
Advisory Action for U.S. Appl. No. 11/831,950, mailed on Mar. 4, 2010, 4 pages.
Final Office Action for U.S. Appl. No. 11/953,742, mailed on Jun. 14, 2010, 21 pages.
Non-Final Office Action for U.S. Appl. No. 11/953,745, mailed on Jun. 14, 2010, 19 pages.
Non-Final Office Action for U.S. Appl. No. 10/810,208, mailed on Feb. 5, 2010, 13 pages.
Final Office Action for U.S. Appl. No. 11/668,322, mailed on Feb. 24, 2010, 33 pages.
Final Office Action for U.S. Appl. No. 10/140,751, mailed on Mar. 25, 2010, 29 pages.
Advisory Action for U.S. Appl. No. 11/745,008, mailed on Apr. 21, 2010, 8 pages.
Notice of Allowance for U.S. Appl. No. 11/621,038, mailed on Apr. 28, 2010, 15 pages.
Non-Final Office Action for U.S. Appl. No. 12/400,594, mailed on May 14, 2010, 53 pages.
Non-Final Office Action for U.S. Appl. No. 12/372,390, mailed on Apr. 22, 2010, 46 pages.
Non-Final Office Action for U.S. Appl. No. 12/070,893, mailed on Jun. 10, 2010, 44 pages.
Advisory Action for U.S. Appl. No. 11/615,769, mailed on May 25, 2010, 3 pages.
U.S. Appl. No. 12/795,492, filed Jun. 7, 2010, Davis et al.
U.S. Appl. No. 12/702,031, filed Feb. 8, 2010, Davis.
U.S. Appl. No. 12/466,277, filed May 14, 2009, Lin.
Final Office Action for U.S. Appl. No. 11/953,743, mailed on Jul. 15, 2010, 21 pages.
Final Office Action for U.S. Appl. No. 11/953,751, mailed on Jun. 25, 2010, 24 pages.
Notice of Allowance for U.S. Appl. No. 10/810,208, mailed on Jul. 15, 2010, 15 pages.
Non-Final Office Action for U.S. Appl. No. 11/668,322, mailed on Jun. 22, 2010, 16 pages.
Notice of Allowance for U.S. Appl. No. 11/854,486, mailed on Jul. 13, 2010, 12 pages.
Final Office Action for U.S. Appl. No. 12/198,697, mailed on Aug. 2, 2010, 55 pages.
Non-Final Office Action for U.S. Appl. No. 12/639,762, mailed on Sep. 1, 2010, 40 pages.
Non-Final Office for U.S. Appl. No. 12/400,645, mailed on Sep. 1, 2010, 45 pages.
Non-Final Office Action for U.S. Appl. No. 12/372,390, mailed on Sep. 13, 2010, 10 pages.
Notice of Allowance for U.S. Appl. No. 11/615,769, mailed on Jul. 12, 2010, 14 pages.
Non-Final Office Action for U.S. Appl. No. 11/646,845, mailed on Oct. 4, 2010, 48 pages.
Non-Final Office Action for U.S. Appl. No. 12/198,697, mailed on Oct. 25, 2010, 36 pages.
Non-Final Office Action for U.S. Appl. No. 12/198,710, mailed on Sep. 28, 2010, 15 pages.
Requirement for Restriction/Election for U.S. Appl. No. 12/639,749, mailed on Dec. 7, 2010, 3 pages.
Final Office Action for U.S. Appl. No. 12/400,594, mailed on Oct. 28, 2010, 13 pages.
Non-Final Office Action for U.S. Appl. No. 12/505,390, mailed on Oct. 28, 2010, 51 pages.
Final Office Action for U.S. Appl. No. 12/070,893, mailed on Nov. 24, 2010, 11 pages.
Non-Final Office Action for U.S. Appl. No. 10/140,751, mailed Dec. 20, 2010, 23 pages.
Notice of Allowance for U.S. Appl. No. 12/400,645, mailed on Jan. 26, 2011, 14 pages.
Non-Final Office Action for U.S. Appl. No. 11/953,742, mailed on Mar. 30, 2011, 23 pages.
Non-Final Office Action for U.S. Appl. No. 11/953,751, mailed on Mar. 29, 2011, 29 pages.
Non-Final Office Action for U.S. Appl. No. 11/779,778, mailed on Feb. 2, 2011, 63 pages.
Final Office Action for U.S. Appl. No. 11/668,322, mailed on Feb. 1, 2011, 17 pages.
Non-Final Office Action for U.S. Appl. No. 12/795,492, mailed on Mar. 17, 2011, 51 pages.
Non-Final Office Action for U.S. Appl. No. 12/198,710, mailed on Mar. 24, 2011, 40 pages.
Notice of Allowance for U.S. Appl. No. 12/639,749, mailed on Feb. 11, 2011, 51 pages.
Notice of Allowance for U.S. Appl. No. 12/639,762, mailed on Mar. 4, 2011, 7 pages.
Notice of Allowance for U.S. Appl. No. 12/400,594, mailed on Mar. 23, 2011, 11 pages.

Notice of Allowance for U.S. Appl. No. 12/372,390, mailed on Mar. 9, 2011, 8 pages.
Non-Final Office Action for U.S. Appl. No. 12/070,893, mailed on Mar. 18, 2011, 7 pages.
Final Office Action for U.S. Appl. No. 11/646,845, mailed on Jun. 9, 2011, 22 pages.
Notice of Allowance for U.S. Appl. No. 11/953,743, mailed on Apr. 28, 2011, 19 pages.
Final Office Action for U.S. Appl. No. 10/140,751, mailed on Jun. 28, 2011, 23 pages.
Non-Final Office Action for U.S. Appl. No. 12/702,031, mailed on Apr. 29, 2011, 5 pages.
Non-Final Office Action for U.S. Appl. No. 12/198,697, mailed on May 20, 2011, 43 pages.
Non-Final Office Action for U.S. Appl. No. 11/646,845, mailed on Oct. 14, 2011, 19 pages.
Non-Final Office Action for U.S. Appl. No. 11/831,950, mailed on Aug. 26, 2011, 45 pages.
Notice of Allowance for U.S. Appl. No. 11/779,778, mailed on Jul. 28, 2011, 11 pages.
Non-Final Office Action for U.S. Appl. No. 11/668,322, mailed on Aug. 30, 2011, 17 pages.
Non-Final Office Action for U.S. Appl. No. 11/745,008, mailed on Sep. 14, 2011, 26 pages.
Final Office Action for U.S. Appl. No. 12/795,492, mailed on Jul. 20, 2011, 11 pages.
Final Office Action for U.S. Appl. No. 12/070,893, mailed on Sep. 21, 2011, 12 pages.
Requirement for Restriction/Election for U.S. Appl. No. 12/466,277, mailed on Aug. 9, 2011, 6 pages.
Final Office Action for U.S. Appl. No. 11/953,742, mailed Oct. 26, 2011, 19 pages.
Notice of Allowance for U.S. Appl. No. 11/953,751, mailed Dec. 7, 2011, 12 pages.
Supplemental Notice of Allowance for U.S. Appl. No. 11/953,751, mailed Dec. 27, 2011, 6 pages.
Notice of Allowance for U.S. Appl. No. 11/668,322, mailed Feb. 10, 2012, 20 pages.
Notice of Allowance for U.S. Appl. No. 12/795,492, mailed Nov. 14, 2011, 10 pages.
Notice of Allowance for U.S. Appl. No. 12/198,697, mailed Nov. 28, 2011, 12 pages.
Notice of Allowance for U.S. Appl. No. 12/198,697, mailed Jan. 5, 2012, 4 pages.
Final Office Action for U.S. Appl. No. 12/198,710, mailed Oct. 19, 2011, 58 pages.
Notice of Allowance for U.S. Appl. No. 12/466,277, mailed on Nov. 2, 2011, 47 pages.

* cited by examiner

SEGMENTED CRC DESIGN IN HIGH SPEED NETWORKS

CROSS-REFERENCES TO RELATED APPLICATIONS

The present disclosure is related to the following commonly assigned co-pending U.S. patent application, which is incorporated herein by reference in its entirety for all purposes: application Ser. No. 11/779,778, filed Jul. 18, 2007, entitled "Techniques For Segmented CRC Design In High Speed Networks."

BACKGROUND OF THE INVENTION

Embodiments of the present invention relate to data processing, and more particularly relate to techniques for efficient generation of Cyclical Redundancy Check (CRC) values in network devices.

A Cyclical Redundancy Check, or CRC, is a type of function that is used to detect errors in digital data. A typical n-bit CRC (e.g., CRC-16, CRC-32, etc.) receives as input a data block represented as a binary value, and divides the binary value by a predetermined n-bit binary divisor to generate a remainder that is characteristic of the data block. The remainder may be used as a checksum to determine, for example, if the data block is later altered during transmission or storage. In the art, the term CRC is often used to refer to both the function and its generated remainder; however, for clarity, the present disclosure will refer to the function as the CRC and the remainder as the CRC value.

In the field of data communications, network protocols such as Ethernet, ATM, and the like employ CRCs to detect transmission errors in messages (i.e., packets or frames) that are sent from one network device to another. For example, in a conventional Ethernet implementation, a transmitting network device (e.g., router, switch, host network interface, etc.) generates a CRC-32 value for each outgoing Ethernet frame, and appends the value to the frame prior to transmission. When the frame is received at a receiving network device, the CRC-32 value is stripped and a new CRC-32 value is generated for the frame. The new CRC-32 value is then compared to the received CRC-32 value to verify the integrity of the data contained within the frame.

A problem with conventional CRC processing circuit implementations is that they cannot efficiently support the high data throughput rates demanded by emerging wire transmission standards such as 100G (i.e., 100 Gigabits per second (Gbps)) Ethernet. The data throughput of a CRC processing circuit is a function of its data line width and its clock speed. For example, a conventional parallel CRC circuit may process 64-bit wide data lines per clock cycle at a speed of 300 Megahertz (Mhz), thereby achieving a theoretical data throughput rate of approximately 64 bits*300 Mhz=19 Gbps, which is sufficient to support 10G (i.e., 10 Gbps) Ethernet. However, achieving a data throughput rate of 100 Gbps and beyond is difficult for conventional CRC processing circuits.

There are several reasons why conventional CRC processing circuits cannot efficiently support high throughput rates such as 100 Gbps. 100 Gbps generally requires a 10× or greater increase in either data line width or clock speed in a conventional 10 Gbps CRC processing circuit design, which is difficult to physically implement in hardware using currently available technologies. Implementing a large data line width also introduces timing issues at the gate level. Further, conventional parallel CRC designs require that the data lines of the input data stream be processed in order. Accordingly, in the case of Ethernet, an entire frame must be received by a receiving network device before a CRC value for the frame can be generated. This imposes a latency that makes it difficult to achieve theoretical data throughput rates, thereby further adversely affecting scalability.

BRIEF SUMMARY OF THE INVENTION

Embodiments of the present invention provide techniques for efficient generation of CRC values in a network environment. Embodiments of the present invention include CRC processing components (e.g., circuits) that can generate CRC values at high data throughput rates (e.g., 100 Gbps or greater), while being capable of being implemented on currently available FPGAs. Accordingly, embodiments of the present invention may be used in network devices such as routers, switches, hubs, host network interfaces and the like to support high speed data transmission standards such as 100G Ethernet and beyond.

In one set of embodiments, a network device comprises a port configured to receive a set of one or more data lines, each data line in the set of data lines having a width and comprising a portion of a message, where at least one data line in the set of data lines is a residue line containing a portion of the message that is smaller than the width of the residue line. The network device further comprises a processing component configured to shift the portion of the message in the residue line from a first boundary of the residue line to a second boundary of the residue line, generate a data line CRC value for each data line, and generate a message CRC value for the message based on the data line CRC values. In some embodiments, the network device is a network switch. In further embodiments, the processing component is a Media Access Controller (MAC). The processing component may be configured to support a data throughput of at least 10 or 100 Gbps.

In one set of embodiments, the message CRC value is generated by aggregating the data line CRC values using a logical operator. For example, the logical operator may be the exclusive-or (XOR) operator.

In various embodiments, generating the message CRC value comprises retrieving a first transformation matrix for one or more data lines in the set of data lines (excluding the residue line), multiplying the data line CRC value by its corresponding first transformation matrix, and generating a partial, accumulated message CRC value by aggregating the transformed CRC values for the data lines excluding the residue line. In one set of embodiments, the first transformation matrix may depend on the position of the data line relative to the other data lines in the set of data lines. Additionally, the first transformation matrix may be pre-computed and retrieved from memory. The embodiment further includes receiving a second transformation matrix, multiplying the partial, accumulated message CRC value by the second transformation matrix, and generating a final message CRC value based on the partial, accumulated message CRC value and the CRC value of the residue line. In one set of embodiments, the second transformation matrix may depend on the size of the message portion in the residue line. Additionally, the first and second transformation matrices may be pre-computed and retrieved from memory.

In one set of embodiments, the final message CRC value is generated by combining the transformed partial, accumulated message CRC value and the CRC value for the residue line using a logical operator. For example, the logical operator may be the XOR operator.

In further embodiments, a CRC value is generated for each data line by splitting each data line into a plurality of sublines, concurrently calculating a CRC value for each subline, and generating a data line CRC value for the data line based on the subline CRC values. Depending on the implementation, the sublines may be of equal or unequal sizes. In various embodiments, the step of generating a data line CRC value for the data line based on the subline CRC values may include retrieving a transformation matrix for each subline where the subline is not the last subline in the data line, multiplying the subline CRC value by its corresponding transformation matrix, and aggregating the transformed subline CRC values and the CRC value for the last subline to generate a data line CRC value. In one set of embodiments, the transformation matrix for a subline may depend on the position of the subline relative to the other sublines of the data line. Additionally, the transformation matrix for a subline may be pre-computed and retrieved from memory.

According to another embodiment of the present invention, a network device comprises a port configured to receive a data stream comprising one or more messages, and a processing component configured to calculate a CRC value for each message in the one or more messages, the calculating comprising shifting a portion of the message in a residue line from a first boundary of the residue line to a second boundary of the residue line. In some embodiments, the network device is a network switch. In further embodiments, the processing component is a Media Access Controller (MAC). The processing component may be configured to support a data throughput of at least 10 or 100 Gbps.

According to another embodiment of the present invention, a network device comprises a port configured to receive a data stream comprising a set of one or more data lines, each data line in the set comprising a portion of a message. The network device further comprises a processing component configured to calculate a CRC value for each data line in the set of data lines, the calculating being independent of the position of the data line relative to the other data lines in the set of data lines, and generate a CRC value for the message based on the data line CRC values. In some embodiments, the network device is a network switch. In further embodiments, the processing component is a Media Access Controller (MAC). The processing component may be configured to support a data throughput of at least 10 or 100 Gbps.

In various embodiments, the calculating a CRC value for each data line is performed concurrently. In additional embodiments, at least one data line in the set of data lines is a residue line containing a portion of the message that is smaller than a width of the residue line.

The foregoing, together with other features, embodiments, and advantages of the present invention, will become more apparent when referring to the following specification, claims, and accompanying drawings.

DETAILED DESCRIPTION OF THE INVENTION

In the following description, for the purposes of explanation, numerous specific details are set forth in order to provide an understanding of the present invention. It will be apparent, however, to one skilled in the art that the present invention may be practiced without some of these specific details. In other instances, well-known structures and devices are shown in block diagram form.

Embodiments of the present invention provide techniques for generating CRC values in an efficient manner. The CRC generation techniques described below may be applied to different domains and contexts. In one embodiment, the techniques may be used in the networking or data communication domain. In the networking environment, the CRC generation techniques may be employed by network devices such as routers, switches, hubs, host network interfaces, etc. that use CRC-based error detection techniques to verify the integrity of data received by the devices. The CRC generation techniques of the present invention are scalable and can support high data throughput rates such as 100 Gbps and greater that are required by many high-speed data transmission standards.

Figure 1A:
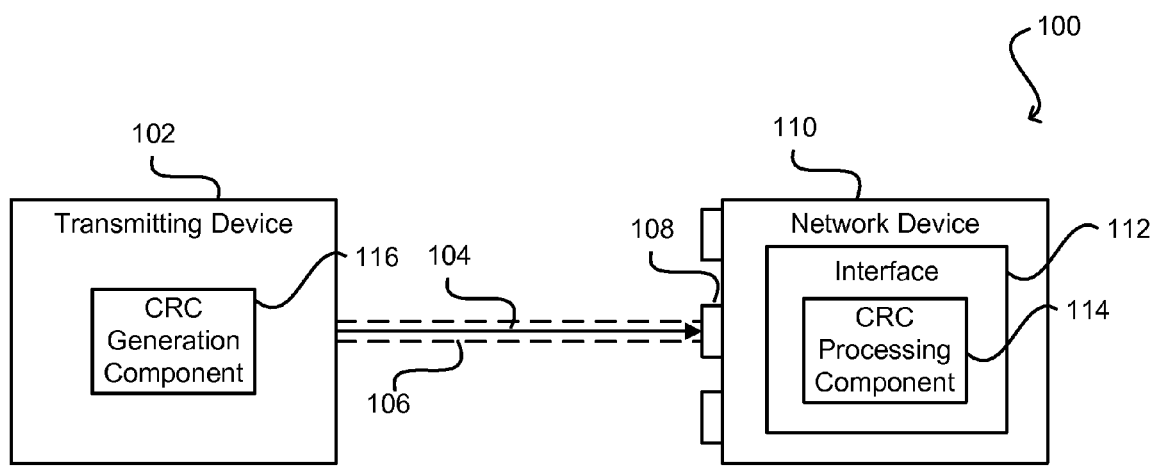
FIGS. 1A and 1B are simplified block diagrams of a system and network environment that may incorporate an embodiment of the present invention.
Figure 1B:
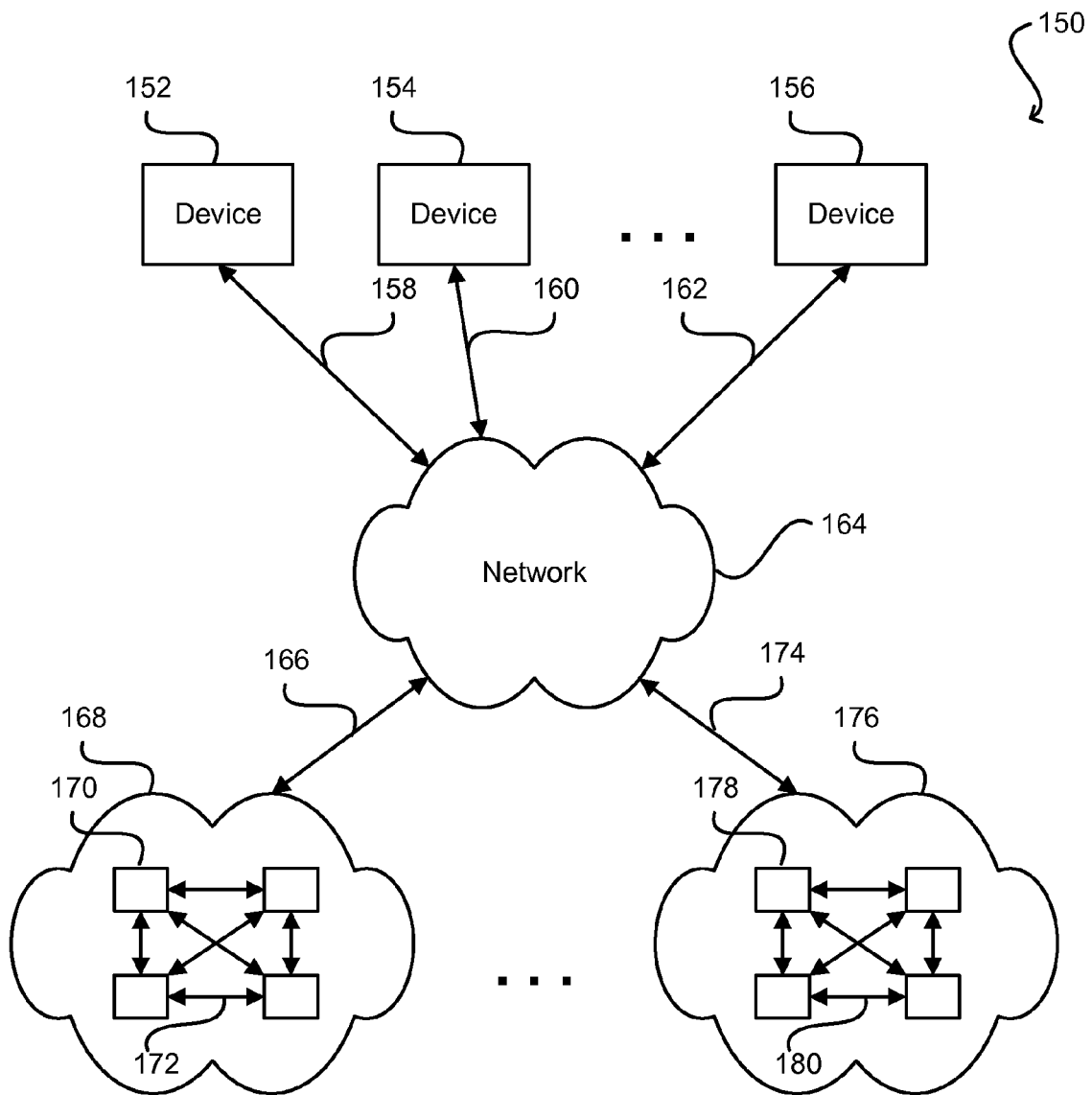

FIG. 1A is a simplified block diagram of a system that may incorporate an embodiment of the present invention. As shown, system 100 comprises a transmitting device 102 coupled to a receiving network device 110 via a data link 106. Receiving network device 110 may be a router, switch, hub, host network interface, or the like. Transmitting device 102 may also be a network device, or may be some other hardware and/or software-based component capable of transmitting data. Although only a single transmitting device and receiving network device are shown in FIG. 1A, it should be appreciated that system 100 may incorporate any number of these devices. Additionally, system 100 may be part of a larger system environment or network, such as a computer network (e.g., a local area network (LAN), wide area network (WAN), the Internet, etc.) as shown in FIG. 1B.

Transmitting device 102 may transmit a data stream 104 to network device 110 using data link 106. Data link 106 may be any transmission medium(s), such as a wired (e.g., optical, twisted-pair copper, etc.) or wireless (e.g., 802.11, Bluetooth, etc.) link(s). Various different protocols may be used to communicate data stream 104 from transmitting device 102 to receiving network device 110. In one embodiment, data stream 104 comprises discrete messages (e.g., Ethernet frames, IP packets) that are transmitted using a network protocol (e.g., Ethernet, TCP/IP, etc.). An embodiment of data stream 104 is described in further detail with respect to FIG. 2 below.

Network device 110 may receive data stream 104 at one or more ports 108. The data stream may comprise one or more messages received by network device 110. The data stream received over a port may then be routed to an interface 112, for example, a Media Access Controller (MAC) as found in Ethernet-based networking equipment. Interface 112 may be configured to perform various processing operations on the data stream, such as buffering of the data stream for forwarding to other components in the network device, updating header information in a message, determining a next destination for a received message, etc. Interface 112 may be implemented, for example, in one or more FPGAs and/or ASICs.

According to an embodiment of the present invention, interface 112 is configured to perform CRC-based error detection on data stream 104. To facilitate this, interface 112 may employ one or more CRC processing components 114. A CRC processing component is configured to generate a CRC value for data block input to the component. A CRC processing component may be implemented in hardware (e.g., microprocessor, logic device such as an FPGA or ASIC, etc.), in software, or combinations of hardware and software. In one embodiment, CRC processing component 114 is a logic-based circuit that is configured to generate a CRC value for a message received in data stream 104 by network device 110. In some embodiments, CRC processing component 114 may further include logic for verifying if the CRC value generated by the component for a received message matches a CRC value that is received from transmitting device 102 for the message. For example, as shown, transmitting device 102 may include a CRC generation component 116 configured to generate a CRC value for a message sent by transmitting device 102. The CRC value may then be appended to the message and extracted by network device 110 from the message in data stream 104. In this manner, CRC processing component 114 may be configured to generate a CRC value for the received data and use the generated value to verify the data integrity of the message received from the transmitting device.

In the example of FIG. 1A, CRC processing component 114 is shown as a subcomponent of interface 112. However, in alternative embodiments CRC processing component 114 may be implemented as a standalone component that is structurally separate from interface 112. In one embodiment, CRC processing component 114 is configured to process data stream 104 at a data throughput rate of 100 Gbps or more. In further embodiments, CRC processing component 114 may be implemented as a single FPGA or ASIC.

FIG. 1B is a simplified block diagram of a network environment that may incorporate an embodiment of the present invention. Network environment 150 may comprise any number of transmitting devices, data links, and receiving devices as described above with respect to FIG. 1A. As shown, network environment 150 includes a plurality network devices 152, 154, 156 and a plurality of sub-networks 168, 176 coupled to a network 164. Additionally, sub-networks 168, 176 include one or more nodes 170, 178.

Network devices 152, 154, 156 and nodes 170, 178 may be any type of device capable of transmitting or receiving data via a communication channel, such as a router, switch, hub, host network interface, and the like. Sub-networks 168, 176 and network 164 may be any type of network that can support data communications using any of a variety of protocols, including without limitation Ethernet, ATM, token ring, FDDI, 802.11, TCP/IP, IPX, and the like. Merely by way of example, sub-networks 168, 176 and network 164 may be a LAN, a WAN, a virtual network (such as a virtual private network (VPN)), the Internet, an intranet, an extranet, a public switched telephone network (PSTN), an infra-red network, a wireless network, and/or any combination of these and/or other networks.

Data may be transmitted between any of network devices 152, 154, 156, sub-networks 168, 176, and nodes 170, 178 via one or more data links 158, 160, 162, 166, 174, 172, 180. Data links 158, 160, 162, 166, 174, 172, 180 maybe configured to support the same or different communication protocols. Further, data links 158, 160, 162, 166, 174, 172, 180 may support the same or different transmission standards (e.g., 10G Ethernet for links between network devices 152, 154, 156 and network 164, 100G Ethernet for links 172 between nodes 170 of sub-network 168).

In one embodiment, at least one data link 158, 160, 162, 166, 174, 172, 180 is configured to support 100G Ethernet. Additionally, at least one device connected to that link (e.g., a receiving device) is configured to support a data throughput of at least 100 Gbps. In this embodiment, the receiving device may correspond to receiving device 110 of FIG. 1A, and may incorporate a CRC processing component in accordance with an embodiment of the present invention.

As indicated above, data stream 104 may comprise data corresponding to one or more messages that are received by receiving network device 110. In the case of the Ethernet protocol, a message corresponds to an Ethernet frame. Messages received via data stream 104 may be of the same size or of variable size. For example, Ethernet supports message sizes up to 1.4 kilobytes. In one embodiment, data stream 104 is received by interface 112, which may be a MAC, and then presented to CRC processing component 114 for generation of a CRC value for a message. In one embodiment, the data stream is presented to CRC processing component 114 in the form of data lines.

Figure 2:
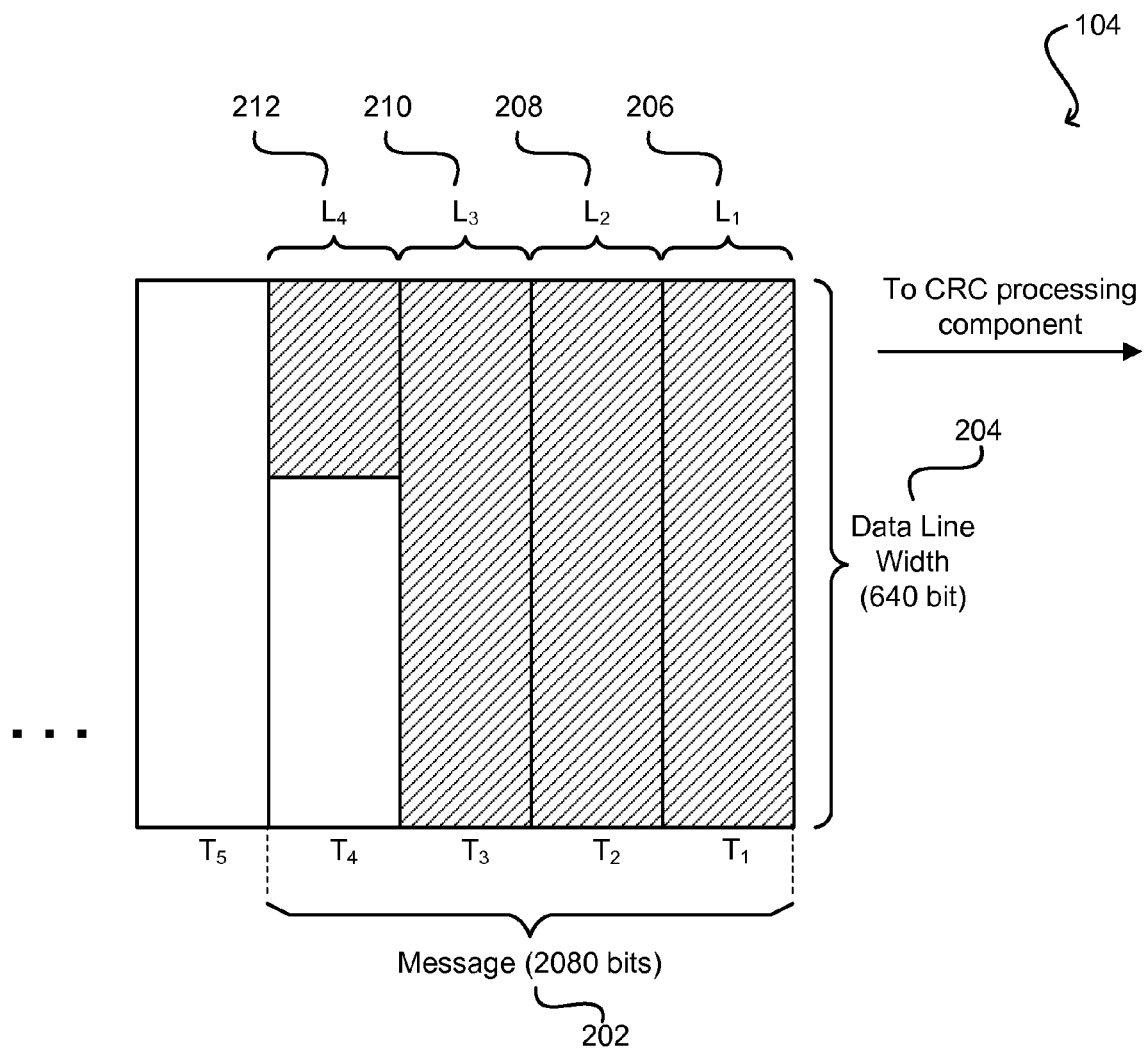
FIG. 2 illustrates a data stream that may be processed in accordance with an embodiment of the present invention.

FIG. 2 illustrates an example of how data stream 104 is presented to CRC processing component 114 according to an embodiment of the present invention. As depicted in FIG. 2, data stream 104 is provided to a CRC processing component as a set of one or more data lines 206, 208, 210, 212, and 214. As used herein, a data line is a fixed-size unit of data that is received and processed by a CRC processing component in a fixed unit of time (usually one clock cycle). For example, as depicted in FIG. 2, line $L_1$ 206 is received at clock cycle $T_1$, line $L_2$ 208 is received at clock cycle $T_2$, line $L_3$ 210 is received at clock cycle $T_3$, line $L_4$ 212 is received at clock cycle $T_4$, and line $L_5$ 214 is received at clock cycle $T_5$.

The width (i.e., size) of a data line may vary from one embodiment to another. The width of the data line is independent of the size of a message supported by a particular transmission protocol. The width of a data line corresponds to the maximum size of data that can be provided as input to CRC processing component 114 per unit of time (e.g., per clock cycle). In the embodiment depicted in FIG. 2, the width of each data line is assumed to be 640 bits.

A message may be contained in one data line or may be spread over multiple data lines with each data line containing a portion of the message. If the size of a message is larger that the data line width, the message will be spread over multiple data lines that may be received and processed over a number of clock cycles. In FIG. 2, a message 202, which is assumed to be 2080 bit long, is spread across four data lines $L_1$ 206, $L_2$ 208, $L_3$ 210, and $L_4$ 212 that are received at clock cycles $T_1$, $T_2$, $T_3$, and $T_4$ by CRC processing component 114. The multiple data lines corresponding to message 202 may be received in order or out of order. In some embodiments, the data lines corresponding to a message may be received interspersed with data lines comprising other data. For the purposes of the example depicted in FIG. 2, data stream 104 is assumed to be received from right to left. Accordingly, $L_1$ (206) is the first data line of message 202 and $L_4$ (212) is the last data line of message 202.

In certain instances, a data line for a message may contain message data that is smaller in size that the width of the data line. This may occur, for instance, if the total size of the message is smaller than the data line width or is not a multiple of the data line width (i.e., the message has a data granularity that is not aligned with the data line width). As used herein, data granularity refers to the smallest physical unit of data that is transmitted using a particular transmission protocol. In the case of Ethernet protocol, the data granularity is generally 8 bits. Thus, an Ethernet frame may vary in size from 8 bits to 1.4 kilobytes (the maximum frame size) in 8 bit increments (the data granularity). Returning to FIG. 2, message 202 has a data granularity of 8 bits and a total size of 2080 bits, which is not a multiple of 640 bits (the data line width). Accordingly, the last data line for message 202—line L4 (212)—contains an amount of message data (160 bits) (depicted by shading in FIG. 2) that is less than the data line width (640 bits). Such a line wherein the message data included in the data line is smaller than the full width of the data line is known as a residue line for the message. Thus, line $L_4$ (212) is a residue line for message 202.

Figure 3:
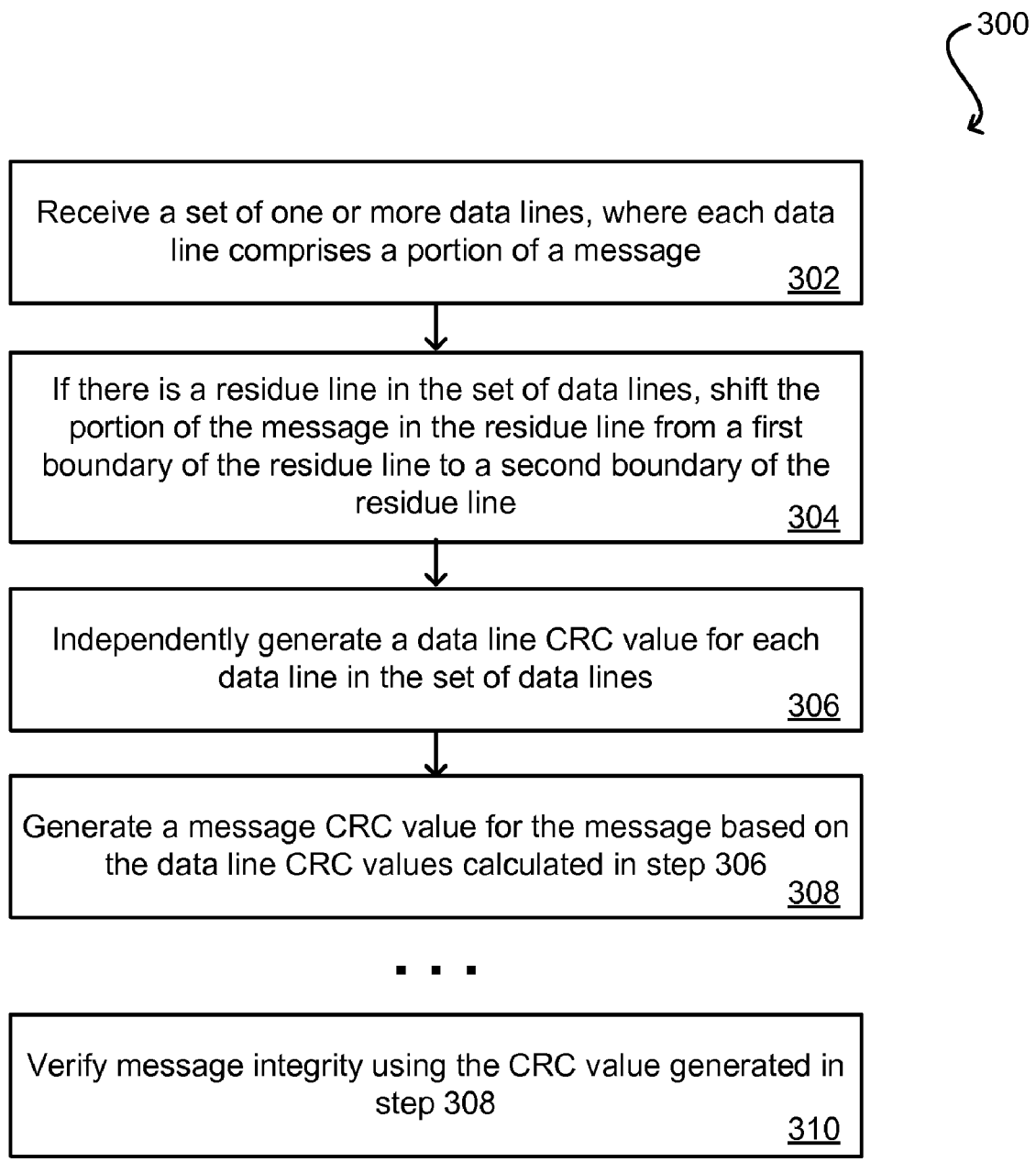
FIG. 3 illustrates the steps performed in generating a CRC value for a message in accordance with an embodiment of the present invention.

According to an embodiment of the present invention, the data lines corresponding to a message are provided to CRC processing component 114 for generating a CRC value for the message. FIG. 3 depicts a flowchart 300 showing a method for generating a CRC value for a message in accordance with an embodiment of the present invention. The processing depicted in FIG. 3 may be performed by software modules (e.g., program of code, instructions), hardware modules (e.g., microprocessors, logic circuits implemented in programmable or custom logic devices, etc.), or combinations thereof. The software modules may be stored on a computer-readable medium. The method depicted in FIG. 3 is merely illustrative of an embodiment of the present invention and is not intended to limit the scope of the present invention. Other variations, modifications, and alternatives are also within the scope of the present invention. In one embodiment, method 300 is performed by one or more CRC processing components, such as component 114 of FIG. 1A.

At step 302, a set of one or more data lines is received, where each data line in the set comprises a portion of a message. Generally, the width of each data line is fixed, and is determined by the data line width supported by the CRC processing component. Thus, if method 300 is performed by a CRC processing component that supports a data line width of 64 bits, the width of each received data line will be 64 bits. Similarly, if method 300 is performed by a CRC processing component that supports a data line width of 640 bits, the width of each received data line will be 640 bits.

If there is a residue line in the set of data lines, the portion of the message in the residue line is shifted from a first boundary of the residue line to a second boundary of the residue line (step 304). In an embodiment, shifting is a bitwise shift operation, where one or more bits in the residue line are moved one or more bit positions and the vacated bit positions are filled in with zeroes. For example, assume that the residue line has a width of 8 bits and contains the binary value 11010000, where the message data is 1101, and where the most significant bit (MSB) boundary is on the left side and the least significant bit boundary (LSB) is on the right side. The data in the residue line may be shifted from the MSB boundary to the LSB boundary such that the binary value in the residue line becomes 00001101. Alternatively, the data in the residue line may be shifted from the LSB boundary to the MSB boundary.

Performing the above shift facilitates computation of a CRC value for the residue line. In the above example, the CRC value for 1101 (i.e., the message data included in the residue line) cannot be directly computed using bit string 11010000 as an input to a CRC generator because the trailing four zeros alter the CRC calculation resulting in a different (incorrect) CRC value being generated. However, if 11010000 is shifted to produce 00001101, the correct CRC value for 1101 can be directly computed using bit string 00001101 because the leading fours zeros do not affect the CRC computation.

In one embodiment, the shifting in step 304 may be performed using a conventional barrel shifter. In other embodiments, other hardware and/or software-based methods known to those skilled in the art may be used for shifting.

At step 306, a CRC value (referred to as a data line CRC value) for each data line in the set of data lines corresponding to the message is independently generated. In other words, the calculation of a CRC value for one data line is not dependent on the CRC value for any other data line in the set of data lines for the message. In one embodiment, CRC processing component 114 is configured to generate one data line CRC value per a unit of time (e.g., clock cycle) for the data line received in the unit of time.

Different techniques may be used for calculating a data line CRC value for a data line. In one embodiment, each data line is segmented into sublines, and CRC values are generated for each subline. Each subline may be processed by a separate CRC generator to generate a CRC for the subline. The CRC value for the data line is then calculated based upon the CRC values calculated for the sublines. In alternative embodiments, each data line may be processed as a whole (e.g., passed to a single CRC generator) to generate a data line CRC value.

Once CRC values for each data line including the residue line are generated, a message CRC value for the message is generated based upon the data line CRC values (step 308). In one embodiment, the CRC for the message is calculated by aggregating the CRC values calculated for the data lines using a logical operator such as the exclusive-or (XOR) operator. In another embodiment, one or more of the CRC values generated for the data lines (excluding the residue data line) may be transformed using a transformation matrix and the transformed values may be aggregated using a logical operator, such as the exclusive-or (XOR) operator, to generated a partial, accumulated message CRC value. The partial, accumulated message CRC value may then be transformed using a residue transformation matrix and aggregated with the CRC value of the residue line to generate a message CRC value. This embodiment is discussed in further detail with respect to FIG. 7 below.

In some embodiments, the message CRC value generated in 308 may optionally be used to verify the integrity of the message (step 310). This may be done by comparing the CRC generated in 308 with a previously calculated message CRC value. The previously calculated message CRC may be communicated from the transmitting device and may be appended to the message received by the receiving network device. The receiving network device is able to extract this previously calculated CRC value and compare it to the message CRC value generated in 308 in order to determine the integrity of the message. In one embodiment, integrity of the message is confirmed if the message CRC value generated in 308 matches the previously calculated CRC value.

It should be appreciated that the specific steps illustrated in FIG. 3 provide a particular method for generating a CRC value for a message according to an embodiment of the present invention. Other sequences of steps may also be performed according to alternative embodiments. For example, alternative embodiments of the present invention may perform the steps outlined above in a different order. Moreover, the individual steps illustrated FIG. 3 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 4:
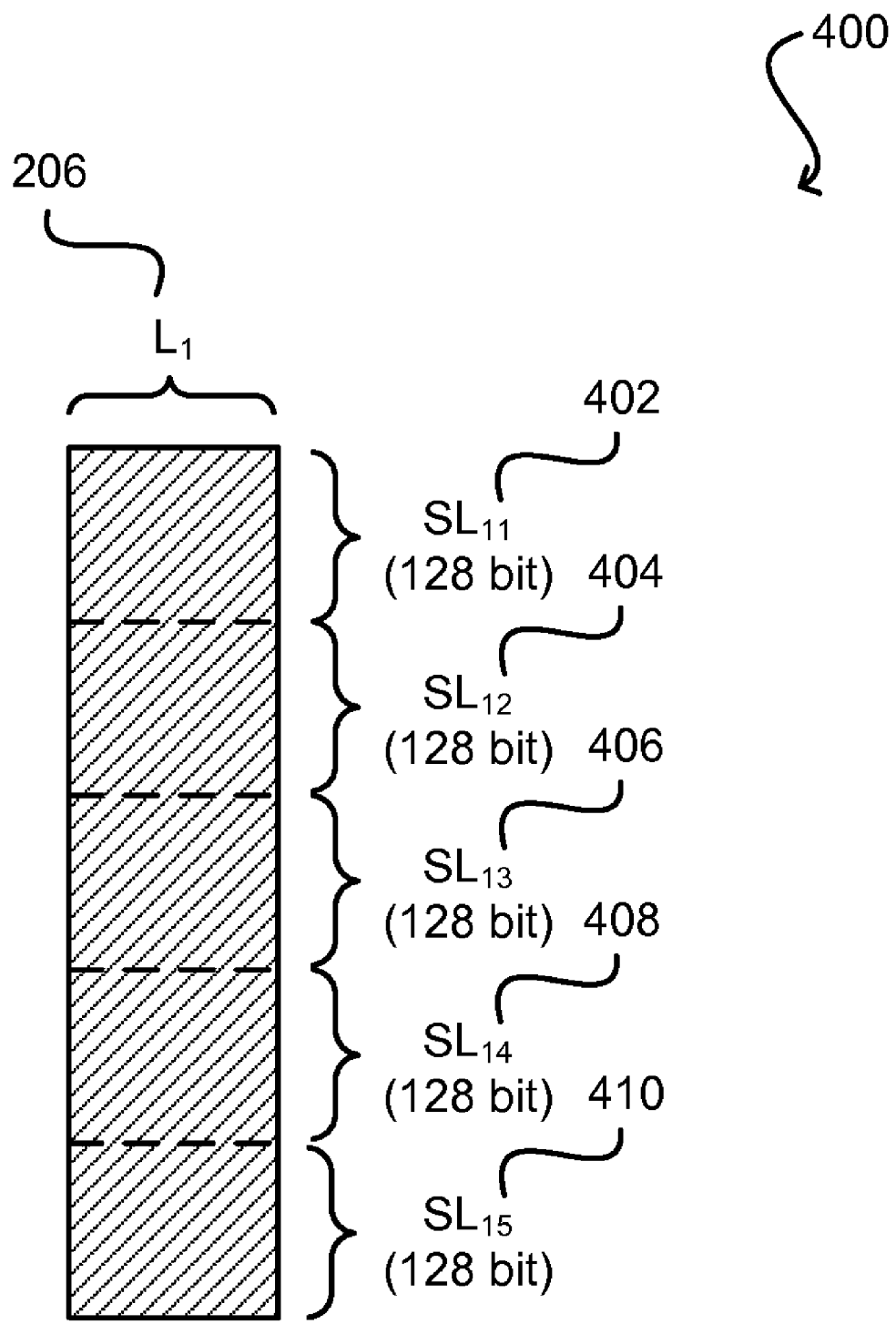
FIG. 4 illustrates a data line that may be processed in accordance with an embodiment of the present invention.

As indicated above, different techniques may be used to calculate a data line CRC value for a data line. In one embodiment, the data line is subdivided into sublines and CRC values calculated for the sublines. The CRC value for the data line is then calculated based upon the subline CRC values. FIG. 4 illustrates an example of how a data line may be subdivided into sublines for computation of a CRC value for the data line according to an embodiment of the present invention. In FIG. 4, the data line is assumed to be line $L_1$ 206 depicted in FIG. 2. The processing may also be applied to other data lines. As depicted in FIG. 4, data line 206 is split into multiple sublines $SL_{11}$ (402), $SL_{12}$ (404), $SL_{13}$ (406), $SL_{14}$ (408), and $SL_{15}$ (410). The sublines may be of the same size or different sizes. As shown, data line $L_1$ is split into sublines of equal size (128 bits). A CRC value may be calculated independently for each subline. A CRC value for the data line is then calculated based upon the CRC values for the sublines. In one embodiment, the subline CRC values are calculated concurrently, thereby speeding up the CRC generation process.

Figure 5A:
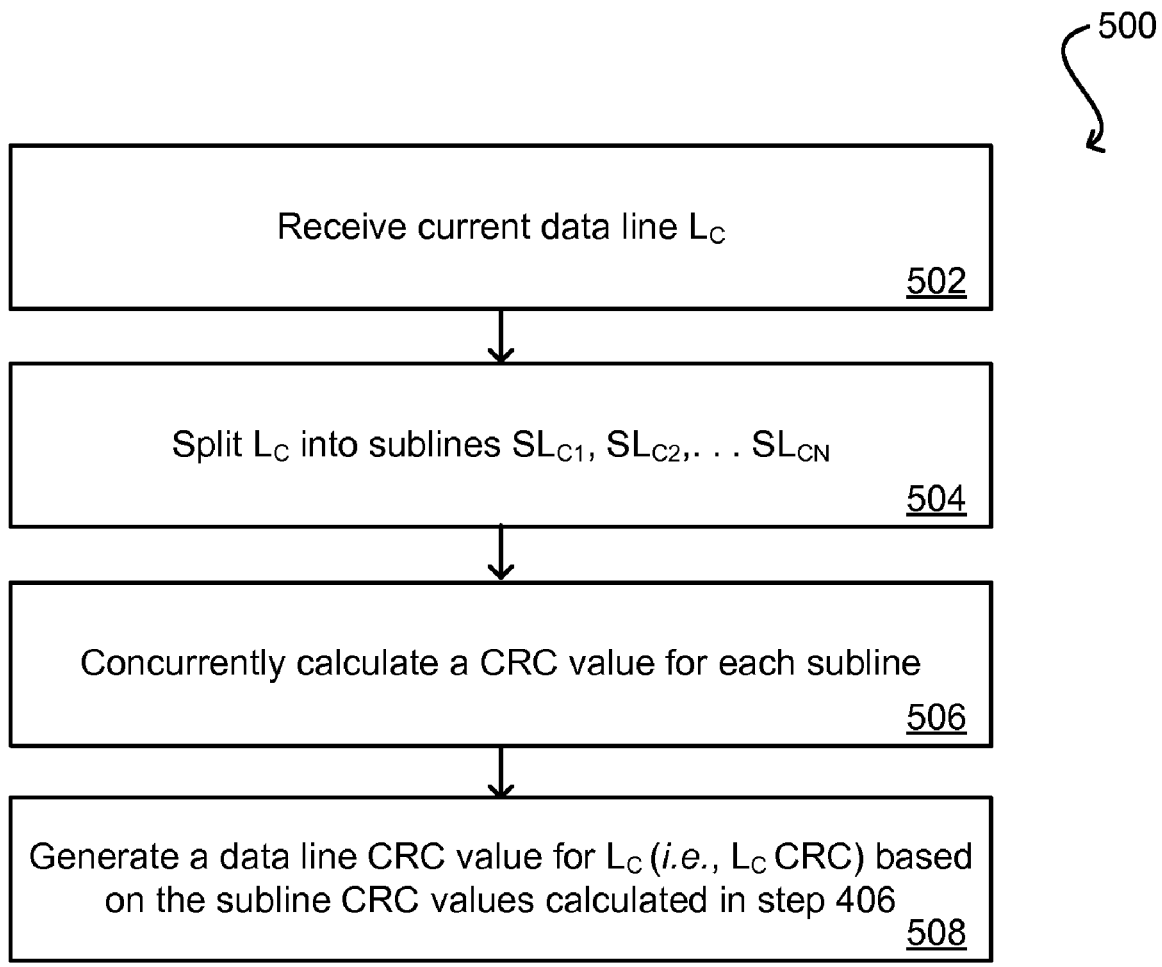
FIGS. 5A and 5B illustrate the steps performed in generating a CRC value for a data line in accordance with an embodiment of the present invention.
Figure 5B:
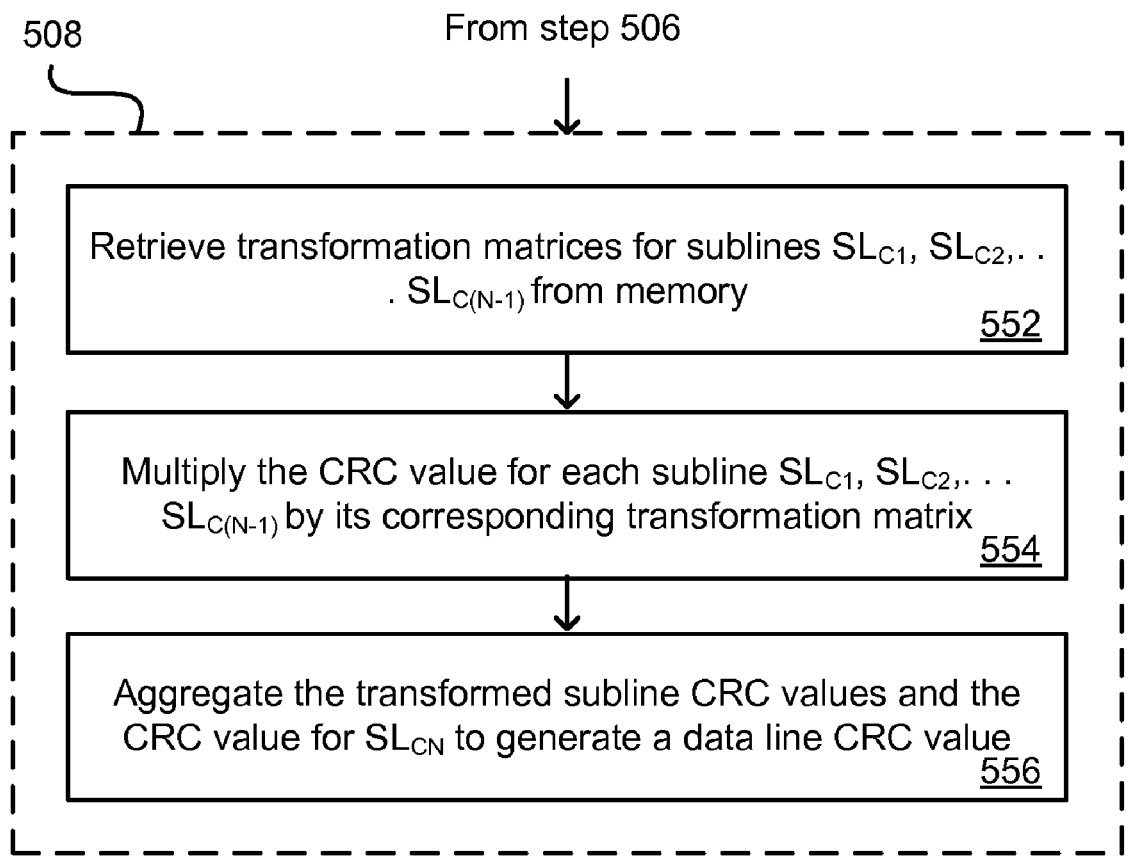

FIGS. 5A and 5B depict flowcharts showing a method 500 for generating a CRC value for a data line in accordance with an embodiment of the present invention. As such, method 500 represents one possible implementation of step 306 of FIG. 3. The processing depicted in FIGS. 5A and 5B may be performed by software modules (e.g., program of code, instructions) hardware modules (e.g., microprocessors, logic circuits implemented in programmable or custom logic devices, etc.), or combinations thereof. The software modules may be stored on a computer-readable medium. The method depicted in FIGS. 5A and 5B is merely illustrative of an embodiment of the present invention and is not intended to limit the scope of the present invention. Other variations, modifications, and alternatives are also within the scope of the present invention. In one embodiment, the method is performed by CRC processing component 114.

At step 502, a data line containing data for a message is received (i.e., the current data line $L_C$ of the message). At step 504, the data line is segmented into N sublines $SL_{C1}$, $SL_{C2}$, ... $SC_{CN}$. The sizes of the sublines may be the same or may be different. For example, as shown in FIG. 4, data line $L_1$ (640 bits wide) is split into five equal-sized sublines ($SL_{11}$, (402), $SL_{12}$ (404), $SL_{13}$ (406), $SL_{14}$ (408), $SL_{15}$ (410)), each 128 bits wide.

At step 506, a CRC value is calculated for each subline generated in 504. In one embodiment, the CRC values for the sublines are calculated concurrently (for example, using N CRC generators).

At step 508, a data line CRC value for the current data line $L_C$ is generated based upon the subline CRC values calculated in step 506. Various other techniques may be used for generating a CRC value for the data line based upon CRC values calculated for the sublines.

The processing in step 508 may include multiple sub-steps as shown in FIG. 5B. As depicted in FIG. 5B, these sub-steps may include retrieving a transformation matrix for each subline (step 552). This may be done concurrently in one embodiment. In one embodiment, transformation matrices are retrieved for each subline excluding the last subline for the data line, i.e. $SL_{CN}$ (step 552 of FIG. 5B). For the purposes of this embodiment, the last subline is considered the subline that is aligned with the LSB boundary of data line $L_C$. However, in other embodiments, the last subline may be the subline that is aligned with the MSB boundary of $L_C$.

The CRC value generated for each subline in 506 (excluding the last subline $SL_{CN}$) is then transformed by multiplying the CRC value with the transformation matrix retrieved for the subline in 552 (step 554). The multiplication yields a transformed CRC value for each subline (except the last subline). Step 554 is performed to mathematically adjust each subline CRC value (excluding the subline value of for the last subline $SL_{CN}$) based on the offset of the subline in data line $L_C$. This allows each subline CRC value to be generated independently of each other and then adjusted based upon the position of the subline.

The transformation matrices for the sublines may be pre-calculated and stored in memory from where they can be accessed during processing. The transformation matrix for each subline CRC is based on the position of the subline relative to the other sublines of $L_C$. Since the last subline $SL_{CN}$ has no offset, the CRC value for $SL_{CN}$ does not need to be adjusted and hence there is no need to retrieve a transformation matrix for the last subline.

The transformed CRC values and the CRC value for the last subline are then aggregated to generate a CRC for the data line (step 556). Various different techniques may be used for aggregating the sublines. In one embodiment, the aggregation is performed using a logical operator such as the exclusive-or (XOR) operator.

It should be appreciated that the specific steps illustrated in FIGS. 4A and 4B provide a particular method for generating a CRC value for a data line according to an embodiment of the present invention. Other sequences of steps may also be performed according to alternative embodiments. For example, alternative embodiments of the present invention may perform the steps outlined above in a different order. Moreover, the individual steps illustrated in FIGS. 4A and 4B may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
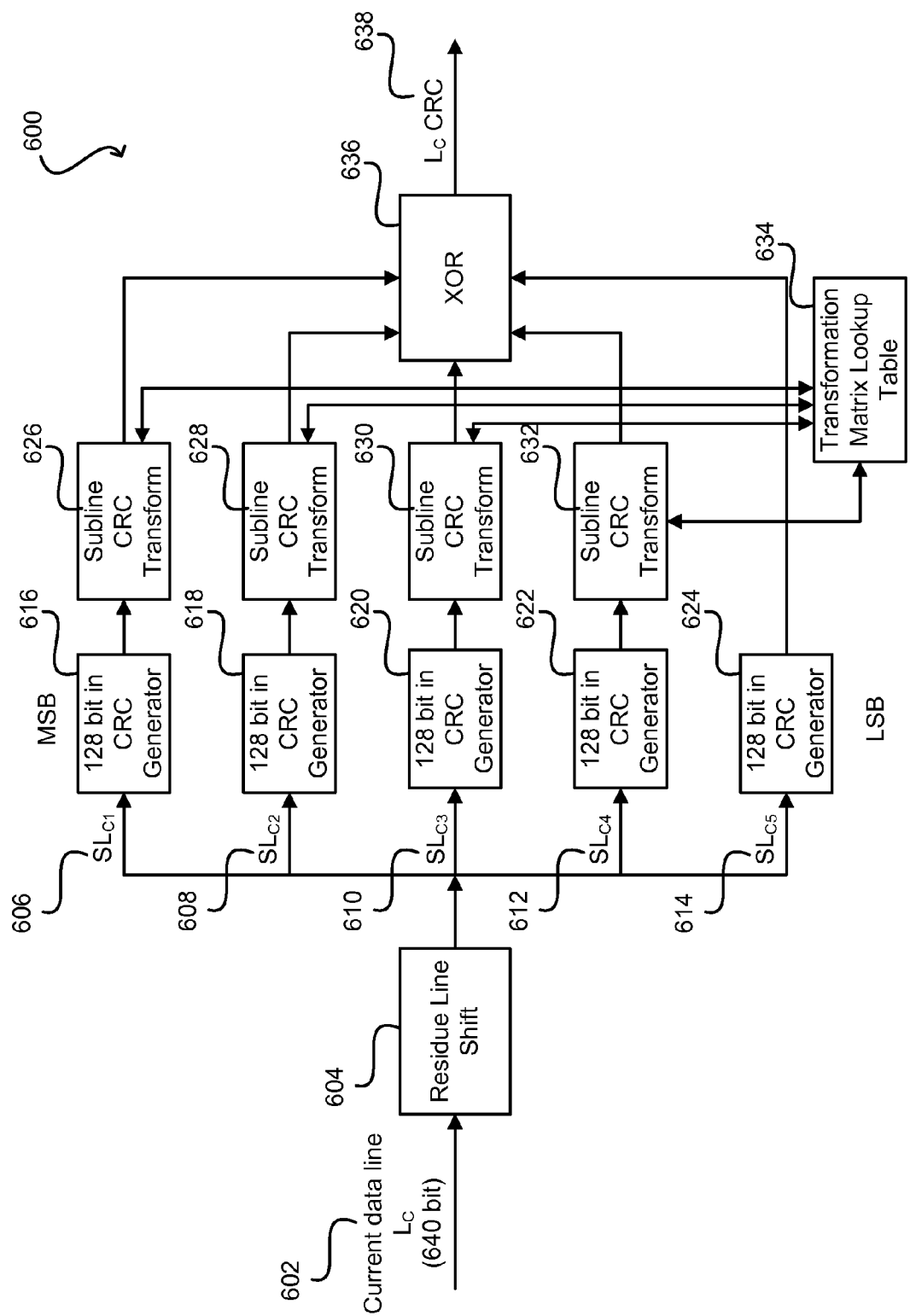
FIG. 6 is a simplified block diagram of a logic circuit configured to generate a CRC value for a data line in accordance with an embodiment of the present invention.

FIG. 6 is a simplified block diagram of a logic circuit 600 configured to generate a CRC value for a data line in accordance with an embodiment of the present invention. Specifically circuit 600 of FIG. 6 illustrates one possible hardware-based implementation of method 500. FIG. 6 is merely illustrative of an embodiment incorporating the present invention and is not intended to limit the scope of the invention as recited in the claims. One of ordinary skill in the art would recognize other variations, modifications, and alternatives. It is assumed that circuit 600 receives data in data lines having a width of 640 bits. The data widths of the data lines may be different in alternative embodiments.

As shown, circuit 600 receives as input a data line 602 having a width of 640 bits, and routes data line 602 to a residue line shift unit 604. If data line 602 is a residue line, the contents of data line 602 are shifted from one boundary to another as previously described with respect to step 304 of FIG. 3. Residue shift unit 604 may be implemented as a barrel shifter or any other mechanism for performing bitwise shifts of data.

Data line 602 is then segmented into five 128-bit sublines (606, 608, 610, 612, 614). The sublines are concurrently passed into five 128-bit-in CRC generators 616, 618, 620, 622, 624, and the CRC generators output a fixed-size CRC value for each subline (e.g., 32 bits for CRC-32).

As shown, the generated CRC values for the first four sublines 606, 608, 610, 612 are routed to subline CRC transform units 626, 628, 630, 632 to be transformed. In this embodiment, the first four sublines are the four sublines that are most closely aligned to the MSB boundary of data line 602. Each CRC transform unit is configured to retrieve a transformation matrix for the subline whose CRC value is input to the CRC transform unit and multiply the subline CRC value by the retrieved matrix. In one embodiment, the transformation matrices are retrieved from a transformation matrix lookup table 634. Table 634 may be implemented in memory (such as an EEPROM, Flash ROM, etc.), and may consist of one or more physical or logical memory units.

Once the CRC values for sublines 606, 608, 610, 612 have been adjusted or transformed via transform units 526, 528, 530, 532, the output from those transform units represent the transformed CRC values for the sublines. As described above, the CRC value for the last subline 614 does not need to be adjusted.

The transformed CRC values for the sublines and the non-transformed CRC value for the last subline are then aggregated using an XOR unit 636. The output 638 from XOR unit 636 corresponds to the generated CRC value for data line 602. In one embodiment, circuit 600 is configured to generate data line CRC value 638 from input data line 602 in a single clock cycle.

It should be appreciated that diagram 600 illustrates one exemplary circuit for generating a data line CRC value, and other alternative configurations are contemplated. For example, although input data line 602 is shown as having a width of 640 bits, circuit 600 may be configured to take as input a data line of any other width. Additionally, although five 128-bit-in generators are shown, circuit 600 may be configured to incorporate any other number and types of CRC generators, such as ten 64 bit-in CRC generators. One of ordinary skill in the art would recognize many variations, modifications, and alternatives.

Figure 7:
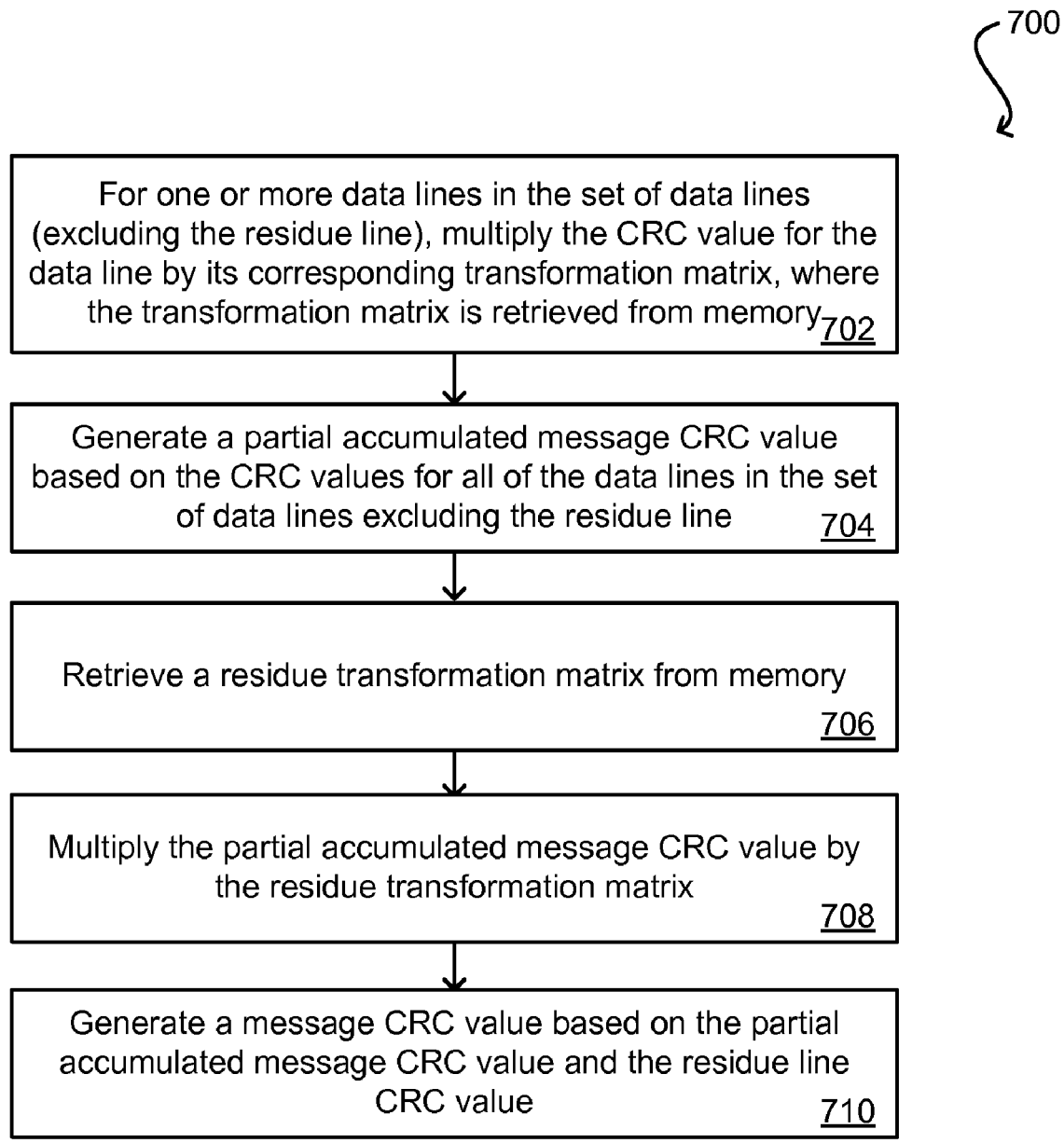
FIG. 7 illustrates the steps performed in aggregating the data line CRC values for a message to generate a message CRC value in accordance with an embodiment of the present invention.

FIG. 7 depicts a flowchart showing a method 700 for generating a CRC value for a message based upon the CRC values calculated for the data lines comprising the message in accordance with an embodiment of the present invention. The processing depicted in FIG. 7 may be performed by software modules (e.g., program of code, instructions), hardware modules (e.g., microprocessors, logic circuits implemented in programmable or custom logic devices, etc.), or combinations thereof. The software modules may be stored on a computer-readable medium. The method depicted in FIG. 7 is merely illustrative of an embodiment of the present invention and is not intended to limit the scope of the present invention. Other variations, modifications, and alternatives are also within the scope of the present invention. In one embodiment, the method is performed by CRC processing component 114 depicted in FIG. 1A. Method 700 of FIG. 7 receives as input the data line CRC values generated by method 500 of FIGS. 5A and 5B, and generates a final message CRC value based upon the data line CRC values. Method 700 may be considered one possible implementation of step 308 of FIG. 3.

At step 702, the CRC values for one or more data lines in the set of data lines (excluding the residue line) are multiplied by corresponding transformation matrices to generate transformed CRC values for the one or more data lines. This step is used to mathematically adjust the CRC value for each of the one or more data lines based on the position of the data line in the message. This allows each data line CRC value to be calculated independently of each other and then transformed using the transformation matrices. In various embodiments, the transformation matrix for each data line is pre-computed and is dependent on the position of the data line relative to other data lines of message. These pre-computed matrices may be stored and retrieved from one or more tables in memory.

A partial, accumulated message CRC value is then generated based on the CRC values for all of the data lines in the set of data lines excluding the residue line (step 704). In one embodiment, the partial, accumulated message CRC value is generated by aggregating the transformed CRC values for one or more data lines (excluding the residue line) with the non-transformed CRC values for one or more data lines (excluding the residue line). For example, for message 202 of FIG. 2 that is segmented into four data lines $L_1$, $L_2$, $L_3$, and $L_4$ (of which $L_4$ is a residue line), the transformed CRC values for lines $L_1$ and $L_2$ would be aggregated with the non-transformed CRC value of $L_3$ to produce a partial, accumulated message CRC value for message 202.

At steps 706 and 708, a residue transformation matrix is retrieved from memory and the partial, accumulated message CRC value generated in 704 is multiplied by the residue transformation matrix. In various embodiments, the residue transformation matrix is used to mathematically adjust the partial, accumulated message CRC value based on the offset of the second-to-last data line (i.e., the data line before the residue line) from the end of the message. Assuming a message spread over M data lines, this step allows the first M–1 data lines to be computed independently of the residue (i.e., Mth) data line. In various embodiments, the residue transformation matrix is pre-computed and is dependent on the size of the message portion in the residue line. In some embodiments, the residue transformation matrix is retrieved from the same table(s) as the data line transformation matrices of step 702. In alternative embodiments, the residue transformation matrix is stored in a separate table in memory.

A final message CRC value is then generated by aggregating the result of 708 with the CRC value of the residue line (step 710). This aggregation may be performed using a logical operator such as the XOR operator.

It should be appreciated that the specific steps illustrated in FIG. 7 provide a particular method for aggregating the data line CRC values for a message to generate a message CRC value according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
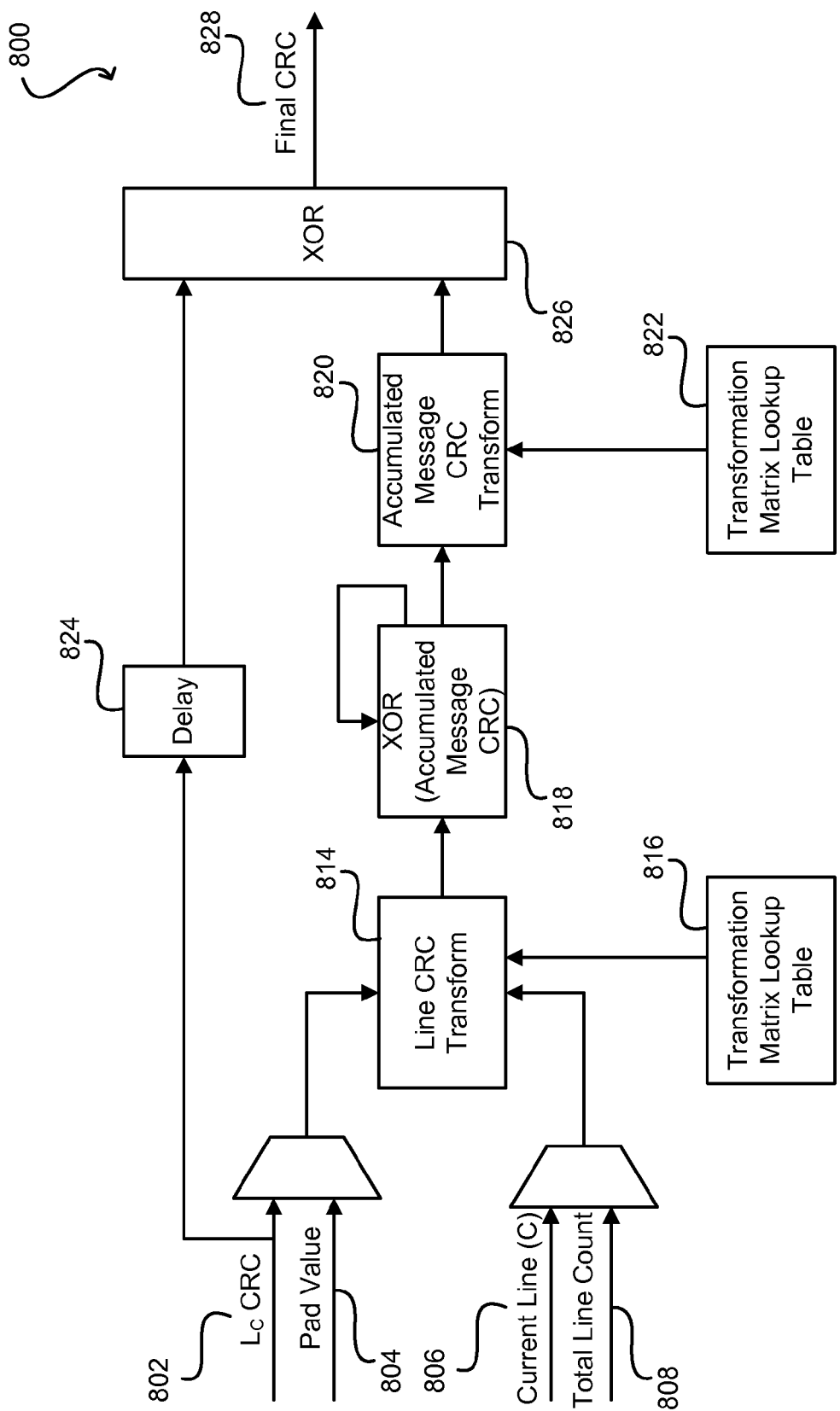
FIG. 8 is a simplified block diagram of a first logic circuit configured to generate a CRC value for a message in accordance with an embodiment of the present invention.

FIG. 8 is a simplified block diagram of a logic circuit configured to generate a CRC value for a message in accordance with an embodiment of the present invention. Specifically, circuit 800 of FIG. 8 represents one possible implementation of method 700 depicted in FIG. 7. As shown, circuit 800 receives as input a CRC value 802 for a current data line $L_C$. Circuit 800 also receives as input a current line count C 806, a total line count 808, and a pad value 804. Current line count C 806 represents the line number of the current line being processed by circuit 800. Total line count 808 represents the total number of lines containing the message. Pad value 804 is a fixed value that is used in some CRC implementations to add a default leading or trailing bit string to each message prior to generating a CRC value for the message. For example, Ethernet requires that the leading 32 bits of a message are 1-bits.

If the current line $L_C$ is not a residue line of the message, the CRC value 802 for $L_C$ is routed to line CRC transform unit 814. Based on current line count C and total line count 808, an appropriate transformation matrix for $L_C$ is retrieved from transformation matrix lookup table 816 and the matrix is multiplied with the CRC value to generate a transformed CRC value for the data line. In one embodiment, a transformation matrix is not retrieved for the second-to-last data line of the message. The output of line CRC transform unit 814 is then passed to XOR unit 818, which stores a partial, accumulated CRC value for the message. If C=1, then the output of line CRC transform unit 814 is simply stored in XOR unit 818. If C>1, then the output of line CRC transform unit 814 is XOR'ed with the partial, accumulated message CRC value already stored in unit 818 to generate a new partial, accumulated message CRC value, and this new value is stored in unit 818.

The above process is repeated over successive clock cycles for successive data lines of the message until a residue line is reached (i.e., current line count C=total line count 808). Once the current line becomes a residue line, the CRC value for the residue line 802 is passed to a delay unit 824. Concurrently, pad value 804 is passed to line CRC transform unit 814, multiplied with an appropriate transformation matrix from table 816, and aggregated with the partial, accumulated message CRC value in XOR unit 818. The partial, accumulated message CRC value is then routed to an accumulated message CRC transform unit 820. Unit 820 retrieves a residue transformation matrix from a second transformation matrix lookup table 822, and multiplies the residue transformation matrix with the partial, accumulated message CRC value. In an exemplary embodiment, the residue transformation matrix is based on the size of the message portion in the residue line.

Finally, the output of unit 820 is aggregated (e.g., XOR'ed) with residue line CRC value 802 at XOR unit 728, and a final message CRC value 828 is generated.

In various embodiments, circuit 800 may be configured to interoperate with circuit 600 of FIG. 6. For example, the circuits may be linked such that the output $L_C$ CRC value 638 generated by circuit 600 is used as the input $L_C$ CRC value 802 of circuit 800 at every clock cycle. In these embodiments, circuits 800 and 600 may be implemented on a single integrated circuit or on an FPGA. Alternatively, circuits 800 and 600 may be implemented on separate physical circuit dies and connected via an electrical bus or other type of interconnect.

It should be appreciated that circuit 800 illustrates one example of a circuit for generating a message CRC value, and other alternative configurations are contemplated. For example, although circuit 800 aggregates data line CRC values incrementally (via partial, accumulated message CRC value), circuit 800 may be configured to postpone the aggregation of the data line CRC values until the last data line of the message has been received. Additionally, although circuit 800 is shown as receiving a pad value 804, other embodiments may not require a pad value. One of ordinary skill in the art would recognize many variations, modifications, and alternatives.

To further clarify the operation of circuit 800, the following table shows examples of values for (1) received $L_C$ CRC value 802, (2) the partial, accumulated message CRC value stored in unit 818, and (3) final message CRC value 828 as circuit 800 processes message 202 of FIG. 2. This example assumes that the data line width of circuit 800 is 640 bits. Therefore, message 202 (which is 2080 bits wide) is processed as four data lines $L_1$ through $L_4$ with $L_4$ being a residue line, and over four clock cycles $T_1$ through $T_4$.

| Time | $L_C$ CRC value | Partial, accumulated message CRC value | Final message CRC value |
|---|---|---|---|
| $T_1$ | $L_1$CRC | $L_1$CRC * $T^{2L}$ | N/A |
| $T_2$ | $L_2$CRC | $L_1$CRC * $T^{2L}$ ⊕ $L_2$CRC * $T^{1L}$ | N/A |
| $T_3$ | $L_3$CRC | $L_1$CRC * $T^{2L}$ ⊕ $L_2$CRC * $T^{1L}$ ⊕ $L_3$CRC | N/A |
| $T_4$ | $L_4$CRC | $L_1$CRC * $T^{2L}$ ⊕ $L_2$CRC * $T^{1L}$ ⊕ $L_3$CRC ⊕ 32'hFFFF_FFFF * $T^{3L}$ | ($L_1$CRC * $T^{2L}$ ⊕ $L_2$CRC * $T^{1L}$ ⊕ $L_3$CRC ⊕ 32'hFFFF_FFFF * $T^{3L}$) * $T^{Res}$ ⊕ $L_4$CRC |

At time $T_1$, the CRC value for data line $L_1$ ($L_1$CRC) is received. Since $L_1$ is offset from the beginning of residue line $L_4$ by two full data lines, $L_1$CRC is multiplied by a corresponding transformation matrix $T^{2L}$, and the product of this multiplication is stored as the partial, accumulated message CRC value.

At time $T_2$, the CRC value for data line $L_2$ ($L_2$CRC) is received. Since $L_2$ is offset from the beginning of residue line $L_4$ by one full data line, $L_2$CRC is multiplied by a corresponding transformation matrix $T^{1L}$. The product of this multiplication is then XOR'ed (denoted by the symbol ⊕) with the partial, accumulated message CRC value to generate a new partial value $L_1$CRC*$T^{2L}$⊕$L_2$CRC*$T^{1L}$.

At time $T_3$, the CRC value for data line $L_3$ ($L_3$CRC) is received. Since $L_3$ is the second-to-last data line in message 202, $L_3$ has no offset from the beginning of residue line $L_4$. Accordingly, $L_3$CRC is not multiplied by any transformation matrix. Rather, $L_3$CRC is simply XOR'ed with the partial, accumulated message CRC value to generate a new partial value $L_1$CRC*$T^{2L}$⊕$L_2$CRC*$T^{1L}$⊕$L_3$CRC.

At time $T_4$, the CRC value for residue line $L_4$ ($L_4$CRC) is received. Since $L_4$ is the final data line in message 202, a pad value (32h'FFFF_FFFF for Ethernet) is multiplied by a corresponding transformation matrix $T^{3L}$ and XOR'ed with the partial, accumulated message CRC value to generate a new partial value $L_1$CRC*$T^{2L}$⊕$L_2$CRC*$T^{1L}$⊕$L_3$CRC⊕32'hFFFF_FFFF*$T^{3L}$. The new partial, accumulated message CRC value is then multiplied by a residue transformation matrix $T^{Res}$. Finally, the product of that multiplication is XOR'ed with the residue line CRC value $L_4$CRC to generate the message CRC value for message 202.

Figure 9:
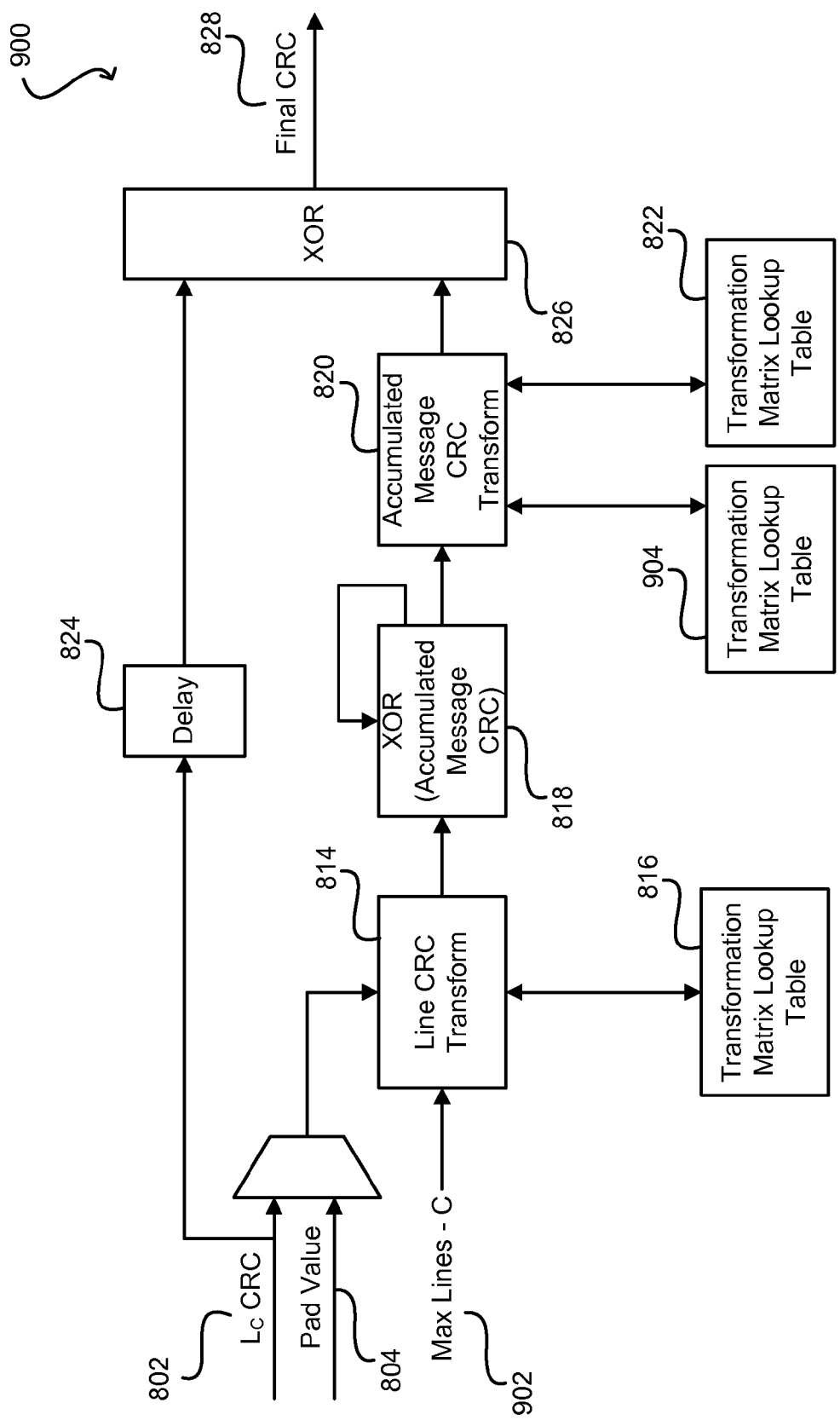
FIG. 9 is a simplified block diagram of a second logic circuit configured to generate a CRC value for a message in accordance with an embodiment of the present invention.

FIG. 9 illustrates an alternative embodiment of circuit 800. As shown, circuit 900 of FIG. 9 is substantially similar to circuit 800 in structure, but does not require a total line count 808. Rather, circuit 900 takes as input max lines—C (902) where max lines represents the maximum number of data lines that a message may span, and C represents the line number of the current data line. Max lines may be computed by dividing the maximum size of a message by a circuit's data line width.

Since, in various embodiments, circuit 900 does not require as input the total number of data lines for a message, circuit 900 can begin processing the message before all of the data lines of the message have been received. In one set of embodiments, circuit 900 may be implemented by modifying the transformation matrices used by circuit 800. For example, the modified matrices used by circuit 900 may be based on the offset of a data line from the maximum size of a message, rather than the offset of the data line from the residue line. Further, circuit 900 may employ an additional inverse transformation matrix (stored in transformation matrix lookup table 904). The inverse matrix may be used to transform the partial, accumulated message CRC value prior to being multiplied by the residue transformation matrix.

Embodiments of the present invention provide solutions for generating CRC values. Since the residue line of a message is handled by shifting the contents of the line (rather than by incorporating multiple CRC generators to account for each possible size of the message data in the residue line as done in the prior art), embodiments of the present invention may be implemented with a number of CRC generators that is independent of data line width, thus improving scalability. For example, circuit 600 of FIG. 6 illustrates an embodiment that uses five 128-bit-in CRC generators to process a data line 640-bits wide. If the data line width is increased to 1280 bits, circuit 600 can still be implemented using only five generators (each 256-bit-in). As such, circuit 600 will not dramatically increase in gate size as data throughput requirements increase. This enables the development of network devices that support high data throughput rates such as 100 Gbps using currently available programmable logic devices (e.g., FPGAs) and process technologies.

Additionally, shifting the contents of the residue line allows embodiments of the present invention to be implemented with one or more CRC generators where (1) the input for each CRC generator is larger than the data granularity of an input message, (2) the input for each CRC generator is smaller than the data line width of a CRC processing circuit; and/or (3) the input for each CRC generator is the same size. For example, circuit 600 of FIG. 6 illustrates an embodiment that uses five 128-bit-in CRC generators to process a data line 640-bits wide. Assume that the data granularity of an input message is 8 bits (which is the data granularity of Ethernet frames). Note that the input size of each CRC generator (128 bits) in circuit 600 is (1) larger than the data granularity of an input message (8 bits), (2) smaller than the data line width of circuit 600 (640 bits), and (3) all of the same size (128 bits).

Further, since the CRC values for the data lines (and sub lines) of a message are mathematically adjusted by an appropriate transformation matrix prior to being aggregated, the data lines can be processed out of order. In the case of Ethernet, this allows a CRC processing component to begin processing a frame before the entire frame has been received over the wire, thereby further increasing performance and scalability.

Although specific embodiments of the invention have been described, various modifications, alterations, alternative constructions, and equivalents are also encompassed within the scope of the invention. The described invention is not restricted to operation within certain specific data processing environments, but is free to operate within a plurality of data processing environments. Additionally, although the present invention has been described using a particular series of transactions and steps, it should be apparent to those skilled in the art that the scope of the present invention is not limited to the described series of transactions and steps.

Further, while the present invention has been described using a particular combination of hardware and software, it should be recognized that other combinations of hardware and software are also within the scope of the present invention. The present invention may be implemented only in hardware, or only in software, or using combinations thereof.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claims.

What is claimed is:

1. A network device comprising:
 a port configured to receive a set of one or more data lines, each data line in the set of data lines having a fixed width and comprising a portion of a message, wherein at least one data line in the set of data lines is a residue line containing a portion of the message that is smaller than the fixed width of the residue line; and
 a processing component configured to:
  shift the portion of the message in the residue line from a first boundary of the residue line to a second boundary of the residue line;
  generate a separate data line CRC value for each data line; and
  generate a message CRC value for the message based on the data line CRC values.

2. The network device of claim 1 wherein the network device is a network switch.

3. The network device of claim 1 wherein the processing component is configured to support a data throughput of at least 10 gigabits per second.

4. The network device of claim 1 wherein the processing component is configured to support a data throughput of at least 100 gigabits per second.

5. The network device of claim 1 wherein the processing component is a Media Access Controller (MAC).

6. The network device of claim 1 wherein generating a message CRC value for the message based on the data line CRC values comprises aggregating the data line CRC values with a logical operator.

7. The network device of claim 6 wherein the logical operator is an XOR operator.

8. The network device of claim 1 wherein generating the message CRC value comprises:
 for one or more data lines in the set of data lines excluding the residue line:
  retrieving a first transformation matrix for each of the one or more data lines, wherein the first transformation matrix is dependent on the position of the data line relative to the other data lines in the set of data lines; and
  multiplying a CRC value for the data line by the first transformation matrix to generate a transformed CRC value for the data line;
 generating a partial accumulated message CRC value by aggregating the transformed CRC values for the data lines in the set of data lines excluding the residue line;
 retrieving a second transformation matrix, wherein the second transformation matrix is dependent on a size of the portion of the message in the residue line;
 multiplying the partial accumulated message CRC value by the second transformation matrix to generate a transformed partial accumulated message CRC value; and generating the message CRC value by aggregating the transformed partial accumulated message CRC value with the CRC value of the residue line.

9. The network device of claim 8 wherein generating the message CRC value further comprises storing the first transformation matrix and the second transformation matrix in a memory accessible to the network device, wherein retrieving the first transformation matrix and the second transformation matrix comprises reading the first transformation matrix and the second transformation matrix from the memory.

10. The network device of claim 1 wherein generating a data line CRC value for each data line in the set of data lines comprises:
   splitting the data line into a plurality of sublines;
   concurrently calculating a CRC value for each subline; and
   generating a data line CRC value for the data line based on the subline CRC values.

11. The network device of claim 10 wherein generating a data line CRC value for the data line based on the subline CRC values comprises:
   if the subline is not the last subline in the data line:
      retrieving a transformation matrix for the subline, wherein the transformation matrix is dependant on the position of the subline relative to the other sublines of the data line;
      multiplying a CRC value for the subline with the transformation matrix retrieved for the subline to generate a transformed subline CRC value; and
   aggregating the transformed subline CRC values and the CRC value for the last subline to generate the data line CRC value.

12. The network device of claim 11 wherein aggregating the transformed subline CRC values and the CRC value for the last subline comprises combining the transformed subline CRC values and the CRC value for the last subline using a logical operator.

13. The network device of claim 12 wherein the logical operator is an XOR operator.

14. The network device of claim 11 wherein generating a data line CRC value for the data line based on the subline CRC values further comprises storing the transformation matrix for the subline in a memory, wherein retrieving a transformation matrix for each subline comprises reading the transformation matrix for the subline from the memory.

15. The network device of claim 1 wherein the first boundary is a most significant bit (MSB) boundary of the residue line and wherein the second boundary is a least significant bit (LSB) boundary of the residue line.

16. The method of claim 1 wherein the set of data lines are ordered, and wherein the residue line is the last data line in the set of data lines.

17. A network device comprising:
   a port configured to receive a data stream comprising one or more messages, each message being split into a set of data lines; and
   a processing component configured to calculate a CRC value for each message by:
      shifting a portion of the message in a residue line from a first boundary of the residue line to a second boundary of the residue line;
      calculating a separate CRC value for each data line in the set of data lines; and
      generate a CRC value for the message based on the data line CRC values.

18. The network device of claim 17 wherein the network device is a network switch.

19. The network device of claim 17 wherein the processing component is configured to support a data throughput of at least 10 gigabits per second.

20. The network device of claim 17 wherein the processing component is configured to support a data throughput of at least 100 gigabits per second.

21. The network device of claim 17 wherein the processing component is a Media Access Controller (MAC).

22. A network device comprising:
   a port configured to receive a data stream comprising a set of one or more data lines, each data line in the set of data lines comprising a portion of a message; and
   a processing component configured to:
      calculate a separate CRC value for each data line in the set of data lines, the calculating being independent of the position of said each data line relative to the other data lines in the set of data lines; and
      generate a CRC value for the message based on the data line CRC values.

23. The network device of claim 22 wherein the network device is a network switch.

24. The network device of claim 22 wherein the processing component is configured to support a data throughput of at least 10 gigabits per second.

25. The network device of claim 22 wherein the processing component is configured to support a data throughput of at least 100 gigabits per second.

26. The network device of claim 22 wherein the processing component is a Media Access Controller (MAC).

27. The network device of claim 22 wherein the calculating a CRC value for each data line is performed concurrently.

28. The network device of claim 22 wherein at least one data line in the set of data lines is a residue line containing a portion of the message that is smaller than a width of the residue line.

29. The method of claim 22 wherein calculating a separate CRC value for each data line in the set of data lines comprises:
   concurrently calculating multiple subline CRC values for the data line, each subline CRC value corresponding to a portion of the data line; and
   calculating the CRC value for the data line based on the multiple subline CRC values.

* * * * *